(12) United States Patent
Yamazaki et al.

(10) Patent No.: US 11,374,029 B2
(45) Date of Patent: Jun. 28, 2022

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Masayuki Sakakura, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/123,321

(22) Filed: Dec. 16, 2020

(65) Prior Publication Data

US 2021/0104556 A1 Apr. 8, 2021

Related U.S. Application Data

(63) Continuation of application No. 16/674,161, filed on Nov. 5, 2019, now Pat. No. 10,916,566, which is a
(Continued)

(30) Foreign Application Priority Data

Jul. 10, 2009 (JP) .................. 2009-164265

(51) Int. Cl.
*H01L 27/12* (2006.01)
*H01L 21/02* (2006.01)
(Continued)

(52) U.S. Cl.
CPC .... *H01L 27/1225* (2013.01); *H01L 21/02565* (2013.01); *H01L 27/124* (2013.01);
(Continued)

(58) Field of Classification Search
CPC .......... H01L 27/1225; H01L 21/02565; H01L 27/124
See application file for complete search history.

(56) References Cited

U.S. PATENT DOCUMENTS 5,162,901 A 11/1992 Shimada et al.
5,299,041 A 3/1994 Morin et al.
(Continued)

FOREIGN PATENT DOCUMENTS

CN 101097340 A 1/2008
EP 0399846 A 11/1990
(Continued)

OTHER PUBLICATIONS

Kimizuka.N et al., "SPINEL,YbFe2O4, and Yb2Fe3O7 Types of Structures for Compounds in the In2O3 and SC2O3—A2O3-BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
(Continued)

*Primary Examiner* — Thao P Le
(74) *Attorney, Agent, or Firm* — Robinson Intellectual Property Law Office; Eric J. Robinson

(57) ABSTRACT

It is an object to manufacture and provide a highly reliable display device including a thin film transistor with a high aperture ratio which has stable electric characteristics. In a manufacturing method of a semiconductor device having a thin film transistor in which a semiconductor layer including a channel formation region is formed using an oxide semiconductor film, a heat treatment for reducing moisture and the like which are impurities and for improving the purity of the oxide semiconductor film (a heat treatment for dehydration or dehydrogenation) is performed. Further, an aperture ratio is improved by forming a gate electrode layer, a source electrode layer, and a drain electrode layer using conductive films having light transmitting properties.

12 Claims, 20 Drawing Sheets

Related U.S. Application Data continuation of application No. 16/191,952, filed on Nov. 15, 2018, now Pat. No. 10,522,568, which is a continuation of application No. 15/695,162, filed on Sep. 5, 2017, now Pat. No. 10,157,936, which is a continuation of application No. 15/342,373, filed on Nov. 3, 2016, now Pat. No. 9,754,974, which is a continuation of application No. 14/730,259, filed on Jun. 4, 2015, now Pat. No. 9,490,277, which is a continuation of application No. 14/486,187, filed on Sep. 15, 2014, now Pat. No. 9,054,138, which is a continuation of application No. 13/856,590, filed on Apr. 4, 2013, now Pat. No. 8,835,920, which is a continuation of application No. 13/658,201, filed on Oct. 23, 2012, now Pat. No. 8,441,011, which is a continuation of application No. 12/832,334, filed on Jul. 8, 2010, now Pat. No. 8,324,027.

(51) Int. Cl.
*H01L 29/786* (2006.01)
*H01L 33/42* (2010.01)
*H01L 29/66* (2006.01)

(52) U.S. Cl.
CPC ...... *H01L 27/1248* (2013.01); *H01L 27/1255* (2013.01); *H01L 29/66969* (2013.01); *H01L 29/7869* (2013.01); *H01L 33/42* (2013.01); *H01L 21/02554* (2013.01); *H01L 2924/0002* (2013.01)

(56) References Cited

U.S. PATENT DOCUMENTS

| | | |
|---|---|---|
| 5,483,082 A | 1/1996 | Takizawa et al. |
| 5,580,796 A | 12/1996 | Takizawa et al. |
| 5,731,856 A | 3/1998 | Kim et al. |
| 5,744,864 A | 4/1998 | Cillessen et al. |
| 5,835,177 A | 11/1998 | Dohjo et al. |
| 5,895,027 A | 4/1999 | Yagi |
| 5,966,190 A | 10/1999 | Dohjo et al. |
| 6,028,652 A | 2/2000 | Dohjo et al. |
| 6,078,366 A | 6/2000 | Dohjo et al. |
| 6,294,274 B1 | 9/2001 | Kawazoe et al. |
| 6,388,726 B1 | 5/2002 | Kim et al. |
| 6,421,101 B1 | 7/2002 | Zhang et al. |
| 6,452,656 B2 | 9/2002 | Niwano et al. |
| 6,563,174 B2 | 5/2003 | Kawasaki et al. |
| 6,686,986 B2 | 2/2004 | Niwano et al. |
| 6,727,522 B1 | 4/2004 | Kawasaki et al. |
| 6,762,802 B2 | 7/2004 | Ono et al. |
| 6,777,887 B2 | 8/2004 | Koyama |
| 6,784,949 B1 | 8/2004 | Nagata et al. |
| 6,835,954 B2 | 12/2004 | Park et al. |
| 6,864,939 B2 | 3/2005 | Niwano et al. |
| 6,882,376 B2 | 4/2005 | Kim et al. |
| 6,888,585 B2 | 5/2005 | Kim |
| 6,921,918 B2 | 7/2005 | Park et al. |
| 7,049,190 B2 | 5/2006 | Takeda et al. |
| 7,052,930 B2 | 5/2006 | Park et al. |
| 7,061,014 B2 | 6/2006 | Hosono et al. |
| 7,064,346 B2 | 6/2006 | Kawasaki et al. |
| 7,081,939 B2 | 7/2006 | Kim |
| 7,094,624 B2 | 8/2006 | Park et al. |
| 7,105,868 B2 | 9/2006 | Nause et al. |
| 7,129,523 B2 | 10/2006 | Yamazaki et al. |
| 7,142,260 B2 | 11/2006 | Yang |
| 7,211,825 B2 | 5/2007 | Shih et al. |
| 7,229,900 B2 | 6/2007 | Takayama et al. |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,351,623 B2 | 4/2008 | Ahn |
| 7,362,401 B2 | 4/2008 | Niwano et al. |
| 7,375,778 B2 | 5/2008 | Kim et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,405,428 B2 | 7/2008 | Yun |
| 7,411,209 B2 | 8/2008 | Endo et al. |
| 7,432,529 B2 | 10/2008 | Yamazaki et al. |
| 7,435,633 B2 | 10/2008 | Todorokihara et al. |
| 7,453,065 B2 | 11/2008 | Saito et al. |
| 7,453,087 B2 | 11/2008 | Iwasaki |
| 7,459,753 B2 | 12/2008 | Horiguchi et al. |
| 7,462,862 B2 | 12/2008 | Hoffman et al. |
| 7,468,304 B2 | 12/2008 | Kaji et al. |
| 7,470,604 B2 | 12/2008 | Fujii |
| 7,491,971 B2 | 2/2009 | Nakamura |
| 7,501,293 B2 | 3/2009 | Ito et al. |
| 7,515,217 B2 | 4/2009 | Yang |
| 7,548,287 B2 | 6/2009 | Oh |
| 7,554,618 B2 | 6/2009 | Ishii et al. |
| 7,583,328 B2 | 9/2009 | Kim |
| 7,595,256 B2 | 9/2009 | Takayama et al. |
| 7,601,984 B2 | 10/2009 | Sano et al. |
| 7,619,245 B2 | 11/2009 | Kim et al. |
| 7,619,254 B2 | 11/2009 | Lee et al. |
| 7,619,256 B2 | 11/2009 | Hirabayashi et al. |
| 7,633,090 B2 | 12/2009 | Ishii |
| 7,635,889 B2 | 12/2009 | Isa et al. |
| 7,674,650 B2 | 3/2010 | Akimoto et al. |
| 7,682,886 B2 | 3/2010 | Kim et al. |
| 7,732,819 B2 | 6/2010 | Akimoto et al. |
| 7,745,798 B2 | 6/2010 | Takahashi |
| 7,768,009 B2 | 8/2010 | Kobayashi et al. |
| 7,773,167 B2 | 8/2010 | Tsai et al. |
| 7,777,224 B2 | 8/2010 | Hosoya et al. |
| 7,781,769 B2 | 8/2010 | Nakamura |
| 7,781,964 B2 | 8/2010 | Hara et al. |
| 7,795,621 B2 | 9/2010 | Yamaguchi et al. |
| 7,804,089 B2 | 9/2010 | Choi et al. |
| 7,808,108 B2 | 10/2010 | Cho et al. |
| 7,834,948 B2 | 11/2010 | Takeda et al. |
| 7,847,289 B2 | 12/2010 | Kim et al. |
| 7,847,892 B2 | 12/2010 | Kim et al. |
| 7,872,698 B2 | 1/2011 | Konishi et al. |
| 7,902,740 B2 | 3/2011 | Sakakura et al. |
| 7,907,224 B2 | 3/2011 | Ito et al. |
| 7,910,271 B2 | 3/2011 | Inoue |
| 7,952,274 B2 | 5/2011 | Muramatsu |
| 7,964,871 B2 | 6/2011 | Iwasaki |
| 8,003,989 B2 | 8/2011 | Nakajima et al. |
| 8,023,055 B2 | 9/2011 | Nakajima et al. |
| 8,045,072 B2 | 10/2011 | Ahn |
| 8,067,294 B2 | 11/2011 | Takayama et al. |
| 8,133,771 B2 | 3/2012 | Kobayashi et al. |
| 8,134,156 B2 | 3/2012 | Akimoto |
| 8,158,464 B2 | 4/2012 | Akimoto |
| 8,158,974 B2 | 4/2012 | Yano et al. |
| 8,174,029 B2 | 5/2012 | Yamazaki et al. |
| 8,273,614 B2 | 9/2012 | Hosoya et al. |
| 8,324,018 B2 | 12/2012 | Isa et al. |
| 8,372,701 B2 | 2/2013 | Lee et al. |
| 8,389,993 B2 | 3/2013 | Kobayashi et al. |
| 8,427,595 B2 | 4/2013 | Yamazaki et al. |
| 8,441,011 B2 | 5/2013 | Yamazaki et al. |
| 8,507,910 B2 | 8/2013 | Ofuji et al. |
| 8,542,338 B2 | 9/2013 | Ahn |
| 8,637,869 B2 | 1/2014 | Lee et al. |
| 8,654,270 B2 | 2/2014 | Nakajima et al. |
| 8,673,739 B2 | 3/2014 | Takayama et al. |
| 8,716,711 B2 | 5/2014 | Iwasaki |
| 8,779,419 B2 | 7/2014 | Yano et al. |
| 8,785,240 B2 | 7/2014 | Watanabe |
| 8,835,920 B2 | 9/2014 | Yamazaki et al. |
| 8,890,167 B2 | 11/2014 | Nam et al. |
| 8,928,010 B2 | 1/2015 | Yamazaki et al. |
| 8,988,625 B2 | 3/2015 | Yamazaki et al. |
| 9,041,875 B2 | 5/2015 | Nakajima et al. |
| 9,111,802 B2 | 8/2015 | Lee et al. |

(56) References Cited

U.S. PATENT DOCUMENTS

| | | |
|---|---|---|
| 9,153,703 B2 | 10/2015 | Kaji et al. |
| 9,291,863 B2 | 3/2016 | Onogi et al. |
| 9,431,426 B2 | 8/2016 | Lee et al. |
| 9,915,843 B2 | 3/2018 | Yamazaki et al. |
| 9,946,125 B2 | 4/2018 | Onogi et al. |
| 10,126,608 B2 | 11/2018 | Onogi et al. |
| 10,126,609 B2 | 11/2018 | Onogi et al. |
| 10,606,133 B2 | 3/2020 | Onogi et al. |
| 2001/0046027 A1 | 11/2001 | Tai et al. |
| 2001/0054991 A1 | 12/2001 | Kimura et al. |
| 2002/0056838 A1 | 5/2002 | Ogawa |
| 2002/0113934 A1 | 8/2002 | Aoki |
| 2002/0132454 A1 | 9/2002 | Ohtsu et al. |
| 2002/0186338 A1 | 12/2002 | Niwano et al. |
| 2003/0096463 A1 | 5/2003 | Nishio |
| 2003/0111663 A1 | 6/2003 | Yagi |
| 2003/0189401 A1 | 10/2003 | Kido et al. |
| 2003/0197208 A1 | 10/2003 | Yamazaki et al. |
| 2003/0218222 A1 | 11/2003 | Wager, III et al. |
| 2004/0038446 A1 | 2/2004 | Takeda et al. |
| 2004/0056587 A1 | 3/2004 | Kim |
| 2004/0066637 A1 | 4/2004 | Imai et al. |
| 2004/0127038 A1 | 7/2004 | Carcia et al. |
| 2004/0164668 A1 | 8/2004 | Kanno et al. |
| 2004/0189919 A1 | 9/2004 | Ahn et al. |
| 2004/0232421 A1 | 11/2004 | Ono et al. |
| 2004/0245525 A1 | 12/2004 | Yamazaki et al. |
| 2005/0007507 A1 | 1/2005 | Ono et al. |
| 2005/0017302 A1 | 1/2005 | Hoffman |
| 2005/0110930 A1 | 5/2005 | Kim |
| 2005/0199959 A1 | 9/2005 | Chiang et al. |
| 2005/0243148 A1 | 11/2005 | Miyazawa. et al. |
| 2005/0253148 A1 | 11/2005 | Yamazaki et al. |
| 2005/0275038 A1 | 12/2005 | Shih et al. |
| 2006/0022201 A1 | 2/2006 | Kim et al. |
| 2006/0027813 A1 | 2/2006 | Kim et al. |
| 2006/0035452 A1 | 2/2006 | Carcia et al. |
| 2006/0043377 A1 | 3/2006 | Hoffman et al. |
| 2006/0077324 A1 | 4/2006 | Ahn |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0192204 A1 | 8/2006 | Yamaguchi et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0034954 A1 | 2/2007 | Cho et al. |
| 2007/0045636 A1 | 3/2007 | Kang et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0158729 A1 | 7/2007 | Yang et al. |
| 2007/0159568 A1 | 7/2007 | Ono et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0216280 A1 | 9/2007 | Hara et al. |
| 2007/0224791 A1 | 9/2007 | Takayama et al. |
| 2007/0252928 A1 | 11/2007 | Ito et al. |
| 2007/0263130 A1 | 11/2007 | Nomura et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0024416 A1 | 1/2008 | Onogi et al. |
| 2008/0038882 A1 | 2/2008 | Takechi et al. |
| 2008/0038929 A1 | 2/2008 | Chang |
| 2008/0042137 A1 | 2/2008 | Horiguchi et al. |
| 2008/0050595 A1 | 2/2008 | Nakagawara et al. |
| 2008/0073649 A1 | 3/2008 | Kim et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0198108 A1 | 8/2008 | Aoki |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284932 A1 | 11/2008 | Heo et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0023236 A1 | 1/2009 | Miyairi et al. |
| 2009/0033818 A1 | 2/2009 | Nakajima et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0224245 A1 | 9/2009 | Umezaki |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0025675 A1 | 2/2010 | Yamazaki et al. |
| 2010/0025678 A1 | 2/2010 | Yamazaki et al. |
| 2010/0032665 A1 | 2/2010 | Yamazaki et al. |
| 2010/0044711 A1 | 2/2010 | Imai |
| 2010/0051938 A1 | 3/2010 | Hayashi et al. |
| 2010/0051949 A1 | 3/2010 | Yamazaki et al. |
| 2010/0065840 A1 | 3/2010 | Yamazaki et al. |
| 2010/0072468 A1 | 3/2010 | Yamazaki et al. |
| 2010/0078633 A1 | 4/2010 | Watanabe |
| 2010/0084648 A1 | 4/2010 | Watanabe |
| 2010/0084651 A1 | 4/2010 | Yamazaki et al. |
| 2010/0084652 A1 | 4/2010 | Yamazaki et al. |
| 2010/0123136 A1 | 5/2010 | Lee et al. |
| 2010/0163867 A1 | 7/2010 | Yamazaki et al. |
| 2010/0323482 A1 | 12/2010 | Choi et al. |
| 2011/0008930 A1 | 1/2011 | Sasaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0049510 A1 | 3/2011 | Yamazaki et al. |
| 2011/0084271 A1 | 4/2011 | Yamazaki et al. |
| 2011/0136301 A1 | 6/2011 | Yamazaki et al. |
| 2011/0215331 A1 | 9/2011 | Yamazaki et al. |
| 2011/0269266 A1 | 11/2011 | Yamazaki |
| 2012/0120334 A1 | 5/2012 | Lee et al. |
| 2012/0258575 A1 | 10/2012 | Sato et al. |
| 2012/0274869 A1 | 11/2012 | Chen et al. |
| 2013/0087794 A1 | 4/2013 | Kwack |

(56) References Cited

U.S. PATENT DOCUMENTS

| | | |
|---|---|---|
| 2013/0175536 A1 | 7/2013 | Yamauchi et al. |
| 2014/0070239 A1 | 3/2014 | Yang et al. |
| 2014/0197414 A1 | 7/2014 | Guo |
| 2015/0255562 A1 | 9/2015 | Nakajima et al. |
| 2017/0084750 A1 | 3/2017 | Yamazaki et al. |
| 2019/0049800 A1 | 2/2019 | Onogi et al. |
| 2019/0346724 A1 | 11/2019 | Onogi et al. |
| 2021/0351224 A1* | 11/2021 | Yamazaki ......... H01L 27/14678 |
| 2021/0399106 A1* | 12/2021 | Yamazaki ........... H01L 29/4908 |
| 2021/0408081 A1* | 12/2021 | Liu ...................... H01L 27/124 |
| 2022/0005790 A1* | 1/2022 | Watanabe ................ G09F 9/30 |
| 2022/0013667 A1* | 1/2022 | Nakada ............. H01L 29/66969 |
| 2022/0026623 A1* | 1/2022 | Yamazaki ............ G02B 6/0055 |

FOREIGN PATENT DOCUMENTS

| | | |
|---|---|---|
| EP | 1037095 A | 9/2000 |
| EP | 1737044 A | 12/2006 |
| EP | 1953813 A | 8/2008 |
| EP | 2192441 A | 6/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-082221 A | 3/1990 |
| JP | 02-310536 A | 12/1990 |
| JP | 05-251705 A | 9/1993 |
| JP | 06-202153 A | 7/1994 |
| JP | 08-264794 A | 10/1996 |
| JP | 09-160076 A | 6/1997 |
| JP | 10-293321 A | 11/1998 |
| JP | 11-119237 A | 4/1999 |
| JP | 11-505377 | 5/1999 |
| JP | 11-326942 A | 11/1999 |
| JP | 2000-044236 A | 2/2000 |
| JP | 2000-131720 A | 5/2000 |
| JP | 2000-150900 A | 5/2000 |
| JP | 2000-357586 A | 12/2000 |
| JP | 2001-053283 A | 2/2001 |
| JP | 2001-324725 A | 11/2001 |
| JP | 2002-006773 A | 1/2002 |
| JP | 2002-076356 A | 3/2002 |
| JP | 2002-214638 A | 7/2002 |
| JP | 2002-258319 A | 9/2002 |
| JP | 2002-289859 A | 10/2002 |
| JP | 2003-086000 A | 3/2003 |
| JP | 2003-086808 A | 3/2003 |
| JP | 2003-140189 A | 5/2003 |
| JP | 2004-103957 A | 4/2004 |
| JP | 2004-247533 A | 9/2004 |
| JP | 2004-273614 A | 9/2004 |
| JP | 2004-273732 A | 9/2004 |
| JP | 2005-178363 A | 7/2005 |
| JP | 3683463 | 8/2005 |
| JP | 3683643 | 8/2005 |
| JP | 2005-303220 A | 10/2005 |
| JP | 2005-338855 A | 12/2005 |
| JP | 2006-133762 A | 5/2006 |
| JP | 2006-148040 A | 6/2006 |
| JP | 2006-206372 A | 8/2006 |
| JP | 2006-237586 A | 9/2006 |
| JP | 2006-242987 A | 9/2006 |
| JP | 2006-245031 A | 9/2006 |
| JP | 2006-259745 A | 9/2006 |
| JP | 2007-033760 A | 2/2007 |
| JP | 2007-053363 A | 3/2007 |
| JP | 2007-073703 A | 3/2007 |
| JP | 2007-096055 A | 4/2007 |
| JP | 2007-109918 A | 4/2007 |
| JP | 2007-115807 A | 5/2007 |
| JP | 2007-123861 A | 5/2007 |
| JP | 2007-150158 A | 6/2007 |
| JP | 2007-155962 A | 6/2007 |
| JP | 2007-183629 A | 7/2007 |
| JP | 2007-293071 A | 11/2007 |
| JP | 2007-298627 A | 11/2007 |
| JP | 2007-299833 A | 11/2007 |
| JP | 2007-310352 A | 11/2007 |
| JP | 2008-015226 A | 1/2008 |
| JP | 2008-186025 A | 8/2008 |
| JP | 2008-218495 A | 9/2008 |
| JP | 2008-227316 A | 9/2008 |
| JP | 2008-243928 A | 10/2008 |
| JP | 2008-281988 A | 11/2008 |
| JP | 2008-286911 A | 11/2008 |
| JP | 2009-099847 A | 5/2009 |
| KR | 2006-0077719 A | 7/2006 |
| KR | 2006-0100872 A | 9/2006 |
| KR | 2007-0015656 A | 2/2007 |
| KR | 2008-0071521 A | 8/2008 |
| TW | 200307893 | 12/2003 |
| TW | I258626 | 7/2006 |
| TW | 200807122 | 2/2008 |
| TW | 200845377 | 11/2008 |
| TW | 200910468 | 3/2009 |
| TW | 200926417 | 6/2009 |
| WO | WO-2004/114391 | 12/2004 |
| WO | WO-2005/121884 | 12/2005 |
| WO | WO-2006/041027 | 4/2006 |
| WO | WO-2006/093028 | 9/2006 |
| WO | WO-2006/093029 | 9/2006 |
| WO | WO-2008/093583 | 8/2008 |
| WO | WO-2008/105250 | 9/2008 |
| WO | WO-2008/117739 | 10/2008 |
| WO | WO-2008/126879 | 10/2008 |

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Lee.H et al., "Current Status of, Challenges To, and Perspective View of AM-OLED ", IDW '06 : Proceedings of the 13th International Display Workshops, Dec. 7, 2006, pp. 663-666.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Nowatari.H et al., "60.2: Intermediate Connector With Suppressed Voltage Loss for White Tandem OLEDs", SID Digest '09 : SID

(56) References Cited

OTHER PUBLICATIONS

International Symposium Digest of Technical Papers, May 31, 2009, vol. 40, pp. 899-902.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Kurokawa.Y et al., "UHF RFCPUS on Flexible and Glass Substrates for Secure RFID Systems", Journal of Solid-State Circuits , 2008, vol. 43, No. 1, pp. 292-299.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.S et al., "Challenge to Future Displays: Transparent AM-OLED Driven by PEALD Grown ZNO TFT", IMID '07 Digest, 2007, pp. 1249-1252.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kitzerow.H et al., "Observation of Blue Phases in Chiral Networks", Liquid Crystals, 1993, vol. 14, No. 3, pp. 911-916.
Kikuchi.H et al., "Polymer-Stabilized Liquid Crystal Blue Phases", Nature Materials, Sep. 2, 2002, vol. 1, pp. 64-68.
Kikuchi.H et al., "62.2:Invited Paper:Fast Electro-optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.
Park.J et al., "High performance amorphous oxide thin film transistors with self-aligned top-gate structure", IEDM 09: Technical Digest of International Electron Devices Meeting, Dec. 7, 2009, pp. 191-194.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Miyasaka.M, "SUFTLA Flexible Microelectronics on Their Way To Business", SID Digest '07 : SID International Symposium Digest of Technical Papers, 2007, vol. 38, pp. 1673-1676.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Nakamura.M, "Synthesis of Homologous Compound with New Long-Period Structure", Nirim Newsletter, Mar. 1, 1995, vol. 150, pp. 1-4.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

ORITA.M et al., "Amorphous transparent conductive oxide lnGaO3(ZnO)m (m<4):a Zn4s conductor", Philosophical Magazine, 2001, vol. 81, No. 5, pp. 501-515.

HOSONO.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

MO.Y et al., "Amorphous Oxide TFT Backplanes for Large Size AMOLED Displays", IDW '08 : Proceedings of the 6TH International Display Workshops, Dec. 3, 2008, pp. 581-584.

KIM.S et al., "High-Performance oxide thin film transistors passivated by various gas plasmas", 214TH Ecs Meeting, 2008, No. 2317, ECS.

CLARK.S et al., "First Principles Methods Using Castep", Zeitschrift fur Kristallographie, 2005, vol. 220, pp. 567-570.

LANY.S et al., "Dopability, Intrinsic Conductivity, and Nonstoichiometry of Transparent Conducting Oxides", Phys. Rev. Lett. (Physical Review Letters), Jan. 26, 2007, vol. 98, p. 045501-1-045501-4.

PARK.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

OH.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

UENO.K et al., "Field-Effect Transistor On SrTi03 With Sputtered Al203 Gate Insulator", Appl. Phys. Lett. (Applied Physics Letters) , Sep. 1, 2003, vol. 83, No. 9, pp. 1755-1757.

International Search Report (Application No. PCT/JP2010/061221) Dated Aug. 3, 2010.

Written Opinion (Application No. PCT/JP2010/061221) dated Aug. 3, 2010.

Taiwanese Office Action (Application No. 102119752) dated Feb. 12, 2015.

Taiwanese Office Action (Application No. 106114308) dated Mar. 23, 2018.

Taiwanese Office Action (Application No. 108134100) dated Mar. 31, 2020.

\* cited by examiner

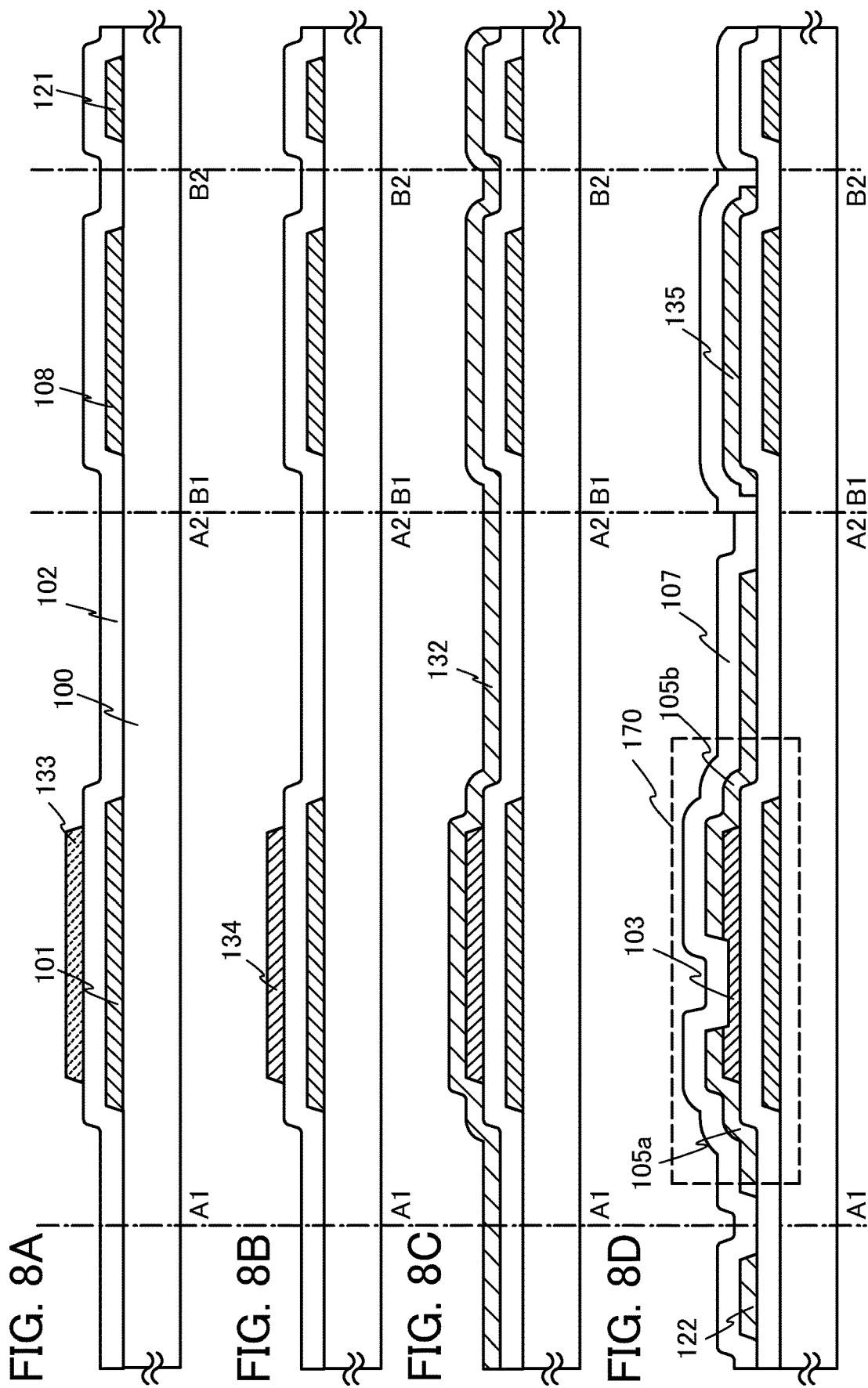

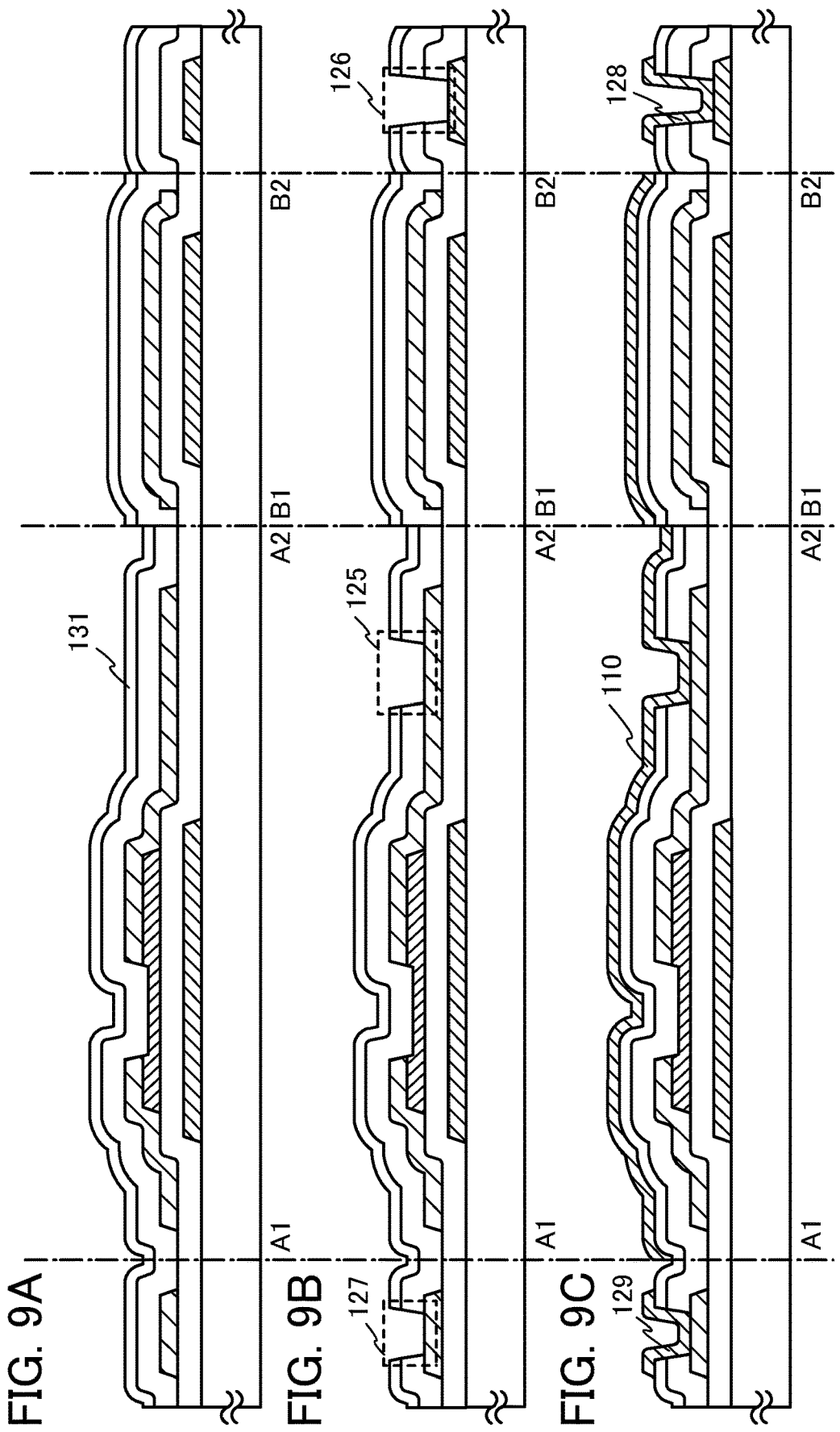

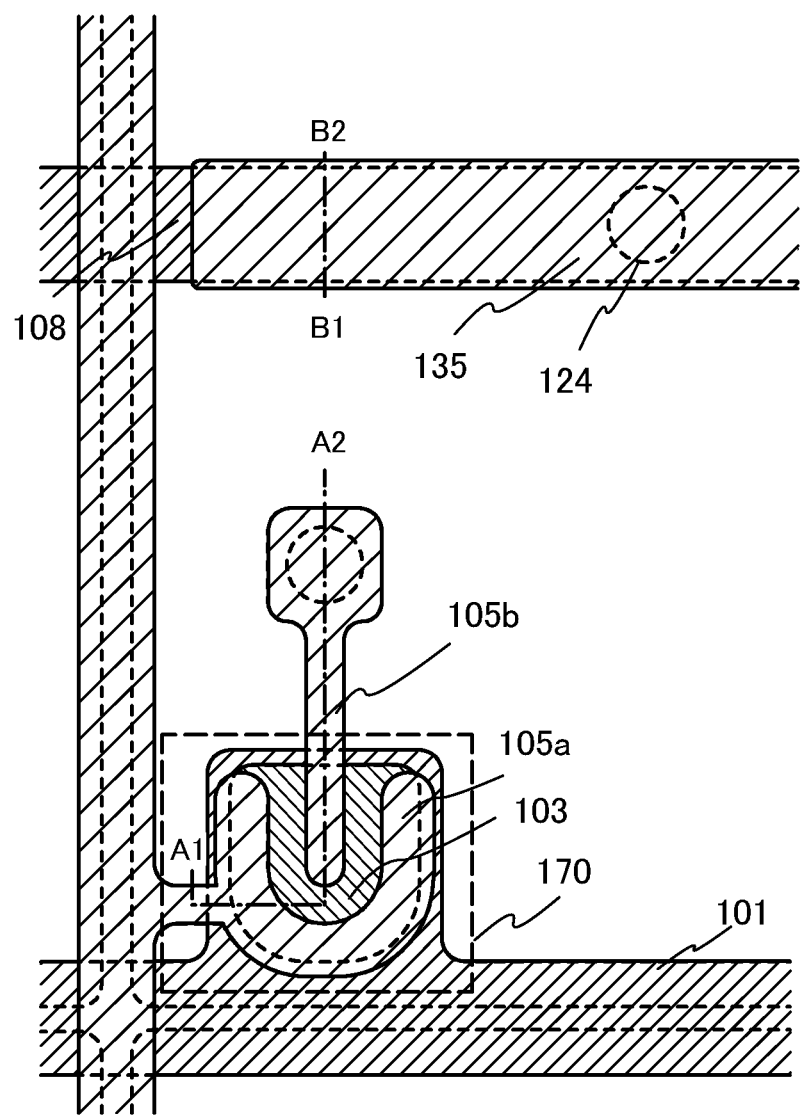

SEMICONDUCTOR DEVICE AND METHOD FOR MANUFACTURING THE SAME

TECHNICAL FIELD

The present invention relates to a semiconductor device having a circuit formed using a thin film transistor (hereinafter referred to as TFT) and a manufacturing method thereof. For example, the present invention relates to electro-optical devices typified by liquid crystal display panels, or electronic devices which have light-emitting display devices containing an organic light-emitting element as a component.

Note that in this specification, a semiconductor device refers to all devices that can function by utilizing semiconductor characteristics. An electro-optical device, a semiconductor circuit, and an electronic appliance are all semiconductor devices.

BACKGROUND ART

Note that as a method for providing a metal auxiliary wiring for a transparent electrode of an electro-optical element, a method by which the metal auxiliary wiring is provided so as to overlap with an upper surface of the transparent electrode or a lower surface of the transparent electrode and to be electrically connected to the transparent electrode has been known (for example, see Patent Document 1).

A structure in which an additional capacitor electrode provided for an active matrix substrate is formed of a conductive film having a light transmitting property of ITO, $SnO_2$, or the like and an auxiliary wiring formed of a metal film is provided in contact with the additional capacitor electrode in order to reduce the electric resistance of the additional capacitor electrode has been known (see Patent Document 2).

Note that it has been known that, as each of a gate electrode, a source electrode, and a drain electrode of a field effect transistor formed using an amorphous oxide semiconductor film, a transparent electrode of indium tin oxide (ITO), indium zinc oxide, ZnO, $SnO_2$, or the like, a metal electrode of Al, Ag, Cr, Ni, Mo, Au, Ti, Ta, or the like, or a metal electrode of an alloy containing any of the above elements can be used; and, by stacking two or more of these layers, contact resistance may be reduced or interface intensity may be improved (for example, see Patent Document 3).

Note that it has been known that, as a material of each of a source electrode, a drain electrode, a gate electrode and an auxiliary capacitor electrode of a transistor formed using an amorphous oxide semiconductor, a metal such as indium (In), aluminum (Al), gold (Au), or silver (Ag), or an oxide material such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$), or zinc tin oxide ($Zn_2SnO_4$) can be used; and the same material or different materials may be used for the gate electrode, the source electrode, and the drain electrode (for example, see Patent Documents 4 and 5).

REFERENCE

[Patent Document 1] Japanese Published Patent Application No. H02-82221
[Patent Document 2] Japanese Published Patent Application No. H02-310536
[Patent Document 3] Japanese Published Patent Application No. 2008-243928
[Patent Document 4] Japanese Published Patent Application No. 2007-109918
[Patent Document 5] Japanese Published Patent Application No. 2007-115807

DISCLOSURE OF INVENTION

However, since a conductive film having a light transmitting property is used just for an electrode material in a conventional display panel which uses an oxide semiconductor, an aperture ratio cannot be improved. In addition, when a display device is manufactured using metal oxide, its reliability has not been taken into consideration.

In view of the above, an object of one embodiment of the present invention is to improve both the aperture ratio and reliability of a display device formed using metal oxide.

In a manufacturing method of a semiconductor device having a thin film transistor in which a semiconductor layer including a channel formation region is formed using an oxide semiconductor film, a heat treatment for reducing moisture and the like which are impurities and for improving the purity of the oxide semiconductor film (a heat treatment for dehydration or dehydrogenation) is performed. Further, impurities such as moisture existing not only in the oxide semiconductor film but also in a gate insulating layer and at interfaces between the oxide semiconductor film and a film above and in contact therewith and between the oxide semiconductor film and a film below and in contact therewith are reduced.

One embodiment of the present invention disclosed in this specification is a manufacturing method of a semiconductor device which includes the steps of: forming a gate electrode layer including metal oxide over a substrate having an insulating surface; forming a gate insulating layer over the gate electrode layer; forming an oxide semiconductor layer over the gate insulating layer; dehydrating or dehydrogenating the oxide semiconductor layer; forming a source electrode layer and a drain electrode layer including metal oxide over the dehydrated or dehydrogenated oxide semiconductor layer; forming a protective insulating layer in contact with part of the oxide semiconductor layer, over the gate insulating layer, the oxide semiconductor layer, the source electrode layer, and the drain electrode layer; and forming a pixel electrode layer including metal oxide over the protective insulating layer.

For dehydration or dehydrogenation, a heat treatment is performed in an oxygen atmosphere, in an inert gas atmosphere such as nitrogen or a rare gas (argon, helium, or the like), or under a reduced pressure at a temperature greater than or equal to 350° C. or preferably greater than or equal to 400° C. and less than the strain point of the substrate, whereby an impurity such as moisture contained in the oxide semiconductor layer is reduced.

Dehydration or dehydrogenation of the oxide semiconductor is conducted with conditions of the heat treatment such that at least a peak at around 300° C. of two peaks of water are/is not detected when the dehydrated or dehydrogenated oxide semiconductor layer is measured with thermal desorption spectroscopy (TDS) while the temperature is increased to 450° C. Therefore, even when a thin film transistor using the dehydrated or dehydrogenated oxide semiconductor layer is subjected to TDS at a temperature as high as 450° C., at least a peak of water at around 300° C. is not detected.

Then, slow cooling is performed from the heating temperature T at which the oxide semiconductor layer is dehydrated or dehydrogenated to a temperature low enough to prevent water from coming in again, specifically to a temperature which is more than 100° C. lower than the heating temperature T, or more preferably to a temperature less than or equal to 100° C.

A gas atmosphere in which the heating temperature T is decreased may be switched to a gas atmosphere different from that in which the temperature is increased to the heating temperature T.

Electric characteristics of a thin film transistor are improved and a thin film transistor having mass productivity and high performance is realized, by using an oxide semiconductor film which is formed by reducing moisture contained in the film by the heat treatment for dehydration or dehydrogenation and then subjected to slow cooling (or cooling) in an atmosphere containing no moisture (the dew point temperature of which is less than or equal to −40° C. or preferably, less than or equal to −60° C.).

In this specification, a heat treatment in an oxygen atmosphere, in an inert gas atmosphere such as nitrogen or a rare gas (argon, helium, or the like), or under a reduced pressure is called a heat treatment for dehydration or dehydrogenation. For convenience, dehydration or dehydrogenation in this specification refers to not only elimination of $H_2$ by a heat treatment but also elimination of H, OH, or the like by a heat treatment.

In the case where a heat treatment is performed in an inert gas atmosphere such as nitrogen or a rare gas (argon, helium, or the like) or under a reduced pressure, it can be said that: an oxide semiconductor layer which has been of an i-type becomes an oxygen deficiency type layer and has low resistance by the heat treatment, i.e., becomes an n-type (such as $n^-$ or $n^+$); and then, by forming an oxide insulating film in contact with the oxide semiconductor layer, the oxide semiconductor layer is placed into a state where oxygen is in excess so as to have a higher resistance, i.e., becomes an i-type. Thus, a semiconductor device including a thin film transistor which has favorable electric characteristics and high reliability can be manufactured and provided.

In the case where the heat treatment is performed in an inert gas atmosphere such as nitrogen or a rare gas (argon, helium, or the like) or under a reduced pressure, and then the atmosphere is switched to an oxygen atmosphere so that slow cooling is performed, an oxide semiconductor layer which has been of an i-type becomes an oxygen deficiency type layer and has low resistance by the heat treatment, i.e., becomes an n-type (such as $n^-$ or $n^+$), and then, the oxide semiconductor layer is placed into a state where oxygen is in excess by the slow cooling in the oxygen atmosphere so as to have a higher resistance, i.e., becomes an i-type.

In addition, in the case where the heat treatment for dehydration or dehydrogenation is performed in an oxygen atmosphere, moisture in the oxide semiconductor layer is released, whereby the oxide semiconductor layer can be placed into a state where oxygen is in excess.

The term "oxide semiconductor" used in this specification is represented by $InMO_3(ZnO)_m$ (m>0), and a thin film transistor in which the thin film of the oxide semiconductor is used as an oxide semiconductor layer is manufactured. Note that M represents one or more metal elements selected from Ga, Fe, Ni, Mn, and Co. As an example, M may be Ga or may include the above metal element in addition to Ga; for example, M may be Ga and Ni or may be Ga and Fe. Moreover, in the above oxide semiconductor, in some cases, a transition metal element such as Fe or Ni or an oxide of the transition metal is contained as an impurity element in addition to a metal element contained as M. In this specification, among the oxide semiconductor whose structures are expressed by $InMO_3 (ZnO)_m$ (m>0), an oxide semiconductor which includes Ga as M is referred to as an In—Ga—Zn—O-based oxide semiconductor and a thin film of the In—Ga—Zn—O-based oxide semiconductor is referred to as an In—Ga—Zn—O-based non-single-crystal film.

As the metal oxide applied to the oxide semiconductor layer, any of the following metal oxide can be applied besides the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Alternatively, the silicon oxide may be included in the oxide semiconductor layer formed using the above metal oxide.

The oxide semiconductor preferably includes In, or more preferably, In and Ga. Dehydration or dehydrogenation is effective in changing the oxide semiconductor layer into an i-type (intrinsic).

In the case where the heat treatment for dehydration or dehydrogenation is performed after the oxide semiconductor layer is formed, the oxide semiconductor layer which is amorphous is changed into a microcrystalline film or a polycrystalline film in some cases depending on the condition of the heat treatment or the material of the oxide semiconductor layer. Further, the oxide semiconductor layer is partially crystallized in some cases; for example, crystal grains (nanocrystals) may be included in the amorphous structure. Even when the oxide semiconductor layer is changed into a microcrystalline film or a polycrystalline film, the thin film transistor can obtain switching characteristics as long as the oxide semiconductor layer is placed into a state where oxygen is in excess to have a higher resistance, i.e., to become an i-type.

However, the oxide semiconductor layer is preferably amorphous in order to reduce off-current of the TFT and to achieve low power consumption.

In order to be amorphous even after the heat treatment for dehydration or dehydrogenation which follows the formation of the oxide semiconductor layer, the oxide semiconductor layer preferably has a small thickness of less than or equal to 50 nm. By making the thickness of the oxide semiconductor layer small, crystallization in the oxide semiconductor layer at the time of the heat treatment after the formation thereof can be suppressed.

Alternatively, in order to be amorphous even after the heat treatment for dehydration or dehydrogenation which follows the formation of the oxide semiconductor layer, the oxide semiconductor layer is made to include silicon oxide ($SiO_x$ (X>0)) which inhibits crystallization, and thus can be prevented from being crystallized when the heat treatment is performed after the oxide semiconductor layer is formed in the manufacturing process.

Note that in this specification, off current is current which flows between a source electrode and a drain electrode when a transistor is in an off state. For example, in an n-channel transistor, the off current is current which flows between a source electrode and a drain electrode when gate voltage is lower than threshold voltage of the transistor.

Further, a gate electrode layer, a source electrode layer, a drain electrode layer, a pixel electrode layer, another electrode layer, or another wiring layer can be formed by a sputtering method, a vacuum evaporation method (such as an electron beam evaporation method), an arc discharge ion plating method or a spray method using a conductive material having a visible light transmitting property such as the following metal oxide: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Further, the silicon oxide may be included in a wiring layer or an electrode layer which is formed of the above metal oxide.

As other materials which may be used for the gate electrode layer, the source electrode layer, the drain electrode layer, the pixel electrode layer, another electrode layer, or another wiring layer, an Al—Zn—O-based non-single-crystal film including nitrogen, which is an Al—Zn—O—N-based non-single-crystal film, a Zn—O—N-based non-single-crystal film including nitrogen, or a Sn—Zn—O—N-based non-single-crystal film including nitrogen may be used. Note that the relative proportion (atomic %) of zinc in an Al—Zn—O—N-based oxide semiconductor film is less than or equal to 47 atomic % and is larger than the relative proportion (atomic %) of aluminum in the oxide semiconductor film. The relative proportion (atomic %) of aluminum in the oxide semiconductor film is larger than the relative proportion (atomic %) of nitrogen in a conductive film having a light transmitting property. Note that the unit of the relative proportion in the conductive film having a light transmitting property is atomic percent, and the relative proportion is evaluated by analysis using an electron probe X-ray microanalyzer (EPMA).

An aperture ratio of a display device can be improved by using a conductive film having a visible light transmitting property for the gate electrode layer, the source electrode layer, the drain electrode layer, the pixel electrode layer, another electrode layer, or another wiring layer. In addition, when a material having a light transmitting property is used also for the oxide semiconductor layer, the aperture ratio can be further improved. By using a film having a light transmitting property for components (a wiring and a semiconductor layer) of a thin film transistor, particularly in a small liquid crystal display device, a high aperture ratio can be achieved even when the size of a pixel is miniaturized for an increase in the number of scan lines, for example, so as to realize high definition of a display image. Further, by using a film having a light transmitting property for components of a thin film transistor, a high aperture ratio can be achieved even when one pixel is divided into a plurality of sub-pixels in order to realize a wide viewing angle. In other words, an aperture ratio can be high even when a group of thin film transistors is densely arranged and an area of a display region can be sufficiently secured. For example, in the case where one pixel includes two to four sub-pixels, an aperture ratio can be improved because not only the thin film transistor but also their respective storage capacitor has a light transmitting property.

Also in a light-emitting display device, a high aperture ratio can be achieved by using a film having a light transmitting property for components (a wiring and a semiconductor layer) of a thin film transistor even when a plurality of thin film transistors is placed in one pixel. In a light-emitting display device using a light-emitting element, a plurality of thin film transistors is included in a pixel portion, and a portion in which a gate electrode of a thin film transistor is electrically connected to a source wiring or a drain wiring of another transistor is also included in the pixel portion. For example, even when two to seven thin film transistors and a storage capacitor are included in one pixel in a light-emitting display device, a high aperture ratio can be achieved because the thin film transistors and the storage capacitor have a light transmitting property.

In addition, when the gate electrode layer, the source electrode layer, the drain electrode layer, the pixel electrode layer, another electrode layer, and another wiring layer are formed using the same material, a common sputtering target and a common manufacturing apparatus can be used; therefore, cost of the material of these layers and an etchant (or an etching gas) which is used in etching can be reduced, resulting in a reduction in manufacturing cost.

In this specification, a film having a visible light transmitting property refers to a film with a thickness which realizes a visible light transmittance of 75% to 100%. Such a film is referred to also as a transparent conductive film. A conductive film which is semitransparent to visible light may be used as metal oxide for the gate electrode layer, the source electrode layer, the drain electrode layer, the pixel electrode layer, another electrode layer, or another wiring layer. When a conductive film is semitransparent to visible light, it has a transmittance of visible light of 50% to 75%.

The thickness of each of the gate electrode layer, the source electrode layer, the drain electrode layer, the pixel electrode layer, another electrode layer, and another wiring layer is set to greater than or equal to 30 nm and less than or equal to 200 nm. A thickness which allows each layer to have a light transmitting property or to be semitransparent to visible light may be selected.

Further, the gate insulating layer and the oxide semiconductor film may be processed successively (also referred to as successive processing, in situ process, or successive formation) without exposure to air. When the gate insulating layer and the oxide semiconductor film are successively processed without exposure to air, the gate insulating layer and the oxide semiconductor film can be formed without contamination of an interface thereof by atmospheric components or impurity elements floating in air, such as moisture or hydrocarbon. Therefore, variation in characteristics between the thin film transistors can be reduced.

Note that the term "successive processing" in this specification means that during a series of a first treatment step by a PCVD method or a sputtering method to a second treatment step by a PCVD method or a sputtering method, an atmosphere in which a substrate to be processed is disposed is not contaminated by a contaminant atmosphere such as air, and is constantly controlled to be vacuum, an inert gas atmosphere (a nitrogen atmosphere or a rare gas atmosphere) or an oxygen atmosphere. By the successive processing, film formation or the like can be performed while preventing moisture or the like from attaching again to the substrate to be processed which is cleaned.

Performing the process from the first treatment step to the second treatment step in the same chamber is within the scope of the successive processing in this specification.

In addition, the following is also within the scope of the successive processing in this specification: in the case of performing the process from the first treatment step to the second treatment step in different chambers, the substrate is transferred after the first treatment step to another chamber without being exposed to air and subjected to the second treatment.

Note that between the first treatment step and the second treatment step, a substrate transfer step, an alignment step, a slow-cooling step, a step of heating or cooling the substrate to a temperature which is necessary for the second step or the like may be provided. Such a process is also within the scope of the successive processing in this specification.

A step in which liquid is used, such as a cleaning step, wet etching, or resist formation, may be provided between the first treatment step and the second treatment step. This case is not within the scope of the successive treatment in this specification.

A semiconductor device having a structure which is obtained by the above manufacturing method is a semiconductor device including: a gate electrode layer over a substrate having an insulating surface; a gate insulating layer over the gate electrode layer; an oxide semiconductor layer over the gate insulating layer; a source electrode layer and a drain electrode layer over the oxide semiconductor layer; a protective insulating layer in contact with part of the oxide semiconductor layer, over the gate insulating layer, the oxide semiconductor layer, the source electrode layer, and the drain electrode layer; and a pixel electrode layer including metal oxide over the protective insulating layer. In the above structure, the gate electrode layer, the gate insulating layer, the oxide semiconductor layer, the source electrode layer, the drain electrode layer, the protective insulating layer, and the pixel electrode layer have a light transmitting property. The pixel electrode layer overlaps with the oxide semiconductor layer and the gate electrode layer.

With the above structure, at least one of the above problems is resolved.

In the above structure, although the pixel electrode layer overlaps with the oxide semiconductor layer and the gate electrode layer, the overlapping region can also serve as a display region, whereby a high aperture ratio can be realized. The pixel electrode layer which overlaps with the oxide semiconductor layer and the gate electrode layer may be a pixel electrode layer of an adjacent pixel. In other words, a structure can be employed in which the pixel electrode layer electrically connected to the oxide semiconductor layer with the source electrode layer and the drain electrode layer therebetween overlaps not with the channel formation region of the oxide semiconductor layer but with the pixel electrode layer of an adjacent pixel.

In a terminal portion in which a plurality of terminal electrodes connected to an external terminal such as an FPC is placed, the terminal electrodes can be formed using the same material and process as the gate electrode layer, the source electrode layer, the drain electrode layer, or the pixel electrode layer.

Further, the storage capacitors in the pixel portion of the liquid crystal display device or the light-emitting display device include a capacitor wiring layer which is formed of a conductive material having a visible light transmitting property, a capacitor electrode layer which is formed of a conductive material having a visible light transmitting property, and the gate insulating layer that is used as a dielectric. Note that the capacitor wiring layer in this case can be formed using the same material and process as the gate electrode layer. In addition, the capacitor electrode layer can be formed using the same material and process as the source electrode layer or the drain electrode layer.

Alternatively, the storage capacitors in the pixel portion of the liquid crystal display device or the light-emitting display device may include a capacitor wiring layer formed of a conductive material having a visible light transmitting property, a pixel electrode layer which is formed of a conductive material having a visible light transmitting property, and the protective insulating layer that is used as a dielectric. The capacitor wiring layer in this case can be formed using the same material and process as the source electrode layer or the drain electrode layer.

Moreover, as a display device including a thin film transistor, a light-emitting display device in which a light-emitting element is used and a display device in which an electrophoretic display element is used, which is also referred to as electronic paper, are given in addition to a liquid crystal display device.

There is no particular limitation on the foregoing liquid crystal display device, and a liquid crystal display device using TN liquid crystal, IPS liquid crystal, OCB liquid crystal, STN liquid crystal, VA liquid crystal, ECB liquid crystal, GH liquid crystal, polymer dispersed liquid crystal, discotic liquid crystal, or the like can be used. Among them, a normally black liquid crystal panel, such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed. Specifically, one pixel is divided into a plurality of sub-pixels and a projection portion is provided in a position of a counter substrate corresponding to the center of each sub-pixel, so that a multi-domain pixel is formed. Such a driving method, in which one pixel is divided into a plurality of sub-pixels and a projection portion is provided at a position of a counter substrate which corresponds to the center of each sub-pixel so that orientation division (multi-domain) of one pixel is performed and a wide viewing angle is achieved, is referred to as sub-pixel driving. It is to be noted that the projection portion may be provided over/on either one or both of the counter substrate and the element substrate. The projection portion makes liquid crystal molecules orient radially and improves controllability of the orientation.

Further, an electrode for driving liquid crystal, that is, a pixel electrode may have a top view shape like a comb-shape or a zigzagged shape so that a direction in which voltage is applied may be varied. Further, a multi-domain pixel may be formed utilizing photo-alignment.

Since a thin film transistor is easily broken due to static electricity or the like, a protective circuit for protecting the thin film transistor in the pixel portion is preferably provided over the same substrate for a gate line or a source line. The protective circuit is preferably formed with a non-linear element including an oxide semiconductor.

In a pixel portion of a display device, by using a film having a light transmitting property for components of a thin film transistor, a high aperture ratio can be achieved even when the size of a pixel is miniaturized for an increase in the number of scan lines, for example, so as to realize high definition of a display image. Further, by using a film having a light transmitting property for components of a thin film transistor, a high aperture ratio can be achieved even when one pixel is divided into a plurality of sub-pixels in order to realize a wide viewing angle.

BRIEF DESCRIPTION OF DRAWINGS

In the accompanying drawings:

FIGS. 8A to 8D are cross-sectional views illustrating manufacturing steps of one embodiment of the present invention;

FIGS. 9A to 9C are cross-sectional views illustrating manufacturing steps of one embodiment of the present invention;

FIG. 10 is a plan view illustrating one embodiment of the present invention;

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

A semiconductor device and a method for manufacturing a semiconductor device will be described with reference to FIGS. 1A to 1C and FIGS. 2A and 2B. In FIG. 2B, a thin film transistor 470 which is one type of a structure called a channel-etch type is illustrated.

Figure 2A:
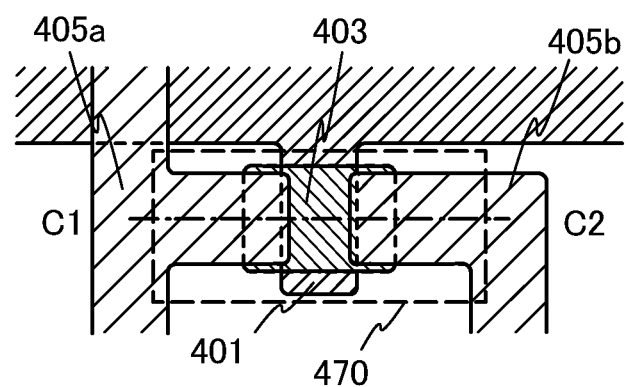
FIGS. 2A and 2B are a plan view and a cross-sectional view, respectively, illustrating one embodiment of the present invention.

FIG. 2A is a plan view of the thin film transistor 470 included in a semiconductor device, and FIG. 2B is a cross-sectional view taken along line C1-C2 of FIG. 2A. The thin film transistor 470 is a bottom gate thin film transistor and includes, over a substrate 400 having an insulating surface, a gate electrode layer 401, a gate insulating layer 402, an oxide semiconductor layer 403, a source electrode layer 405a, and a drain electrode layer 405b. In addition, an oxide insulating film 407 is provided to cover the thin film transistor 470 and be in contact with the oxide semiconductor layer 403.

The substrate 400 having an insulating surface, the gate electrode layer 401, the gate insulating layer 402, the oxide semiconductor layer 403, the source electrode layer 405a, the drain electrode layer 405b, and the oxide insulating film 407 are all formed using a material having a visible light transmitting property. Thus, the thin film transistor 470 has a light transmitting property and an aperture ratio can be improved in the case where the thin film transistor 470 is placed in a pixel portion of a display device.

As for the oxide semiconductor layer 403, at least after an oxide semiconductor film is formed, a heat treatment (a heat treatment for dehydration or dehydrogenation) for reducing moisture and the like which are impurities is performed. The heat treatment for dehydration or dehydrogenation and slow cooling follow the formation of an oxide insulating film in contact with the oxide semiconductor layer, and the like; accordingly, the carrier of the oxide semiconductor layer is reduced to lead to an improvement in the reliability of the thin film transistor 470.

Impurities such as moisture are reduced not only in the oxide semiconductor layer 403 but also in the gate insulating layer 402, at interfaces between the oxide semiconductor layer 403 and a film above and in contact therewith and between the oxide semiconductor layer 403 and a film below and in contact therewith which are specifically an interface between the gate insulating layer 402 and the oxide semiconductor layer 403 and an interface between the oxide insulating film 407 and the oxide semiconductor layer 403.

Hereinafter, cross-sectional views which describe the manufacturing process of the thin film transistor 470 illustrated in FIG. 2B are in FIGS. 1A to 1C.

Figure 1A:
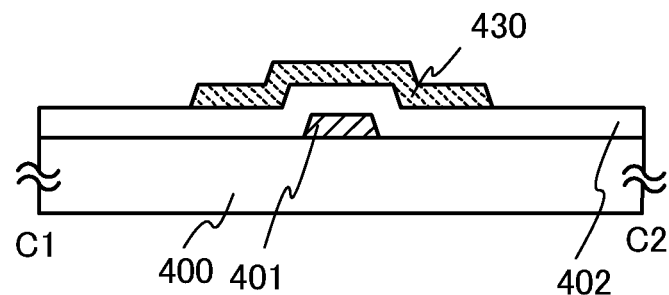
FIGS. 1A to 1C are cross-sectional views illustrating manufacturing steps of one embodiment of the present invention.
Figure 1B:
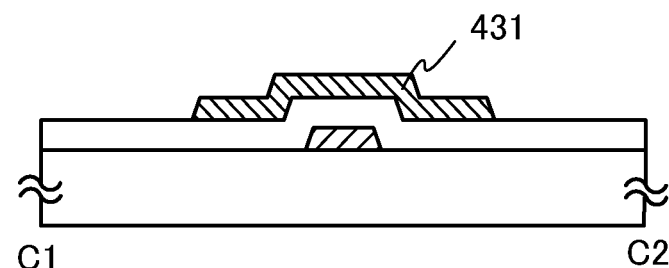
Figure 2B:
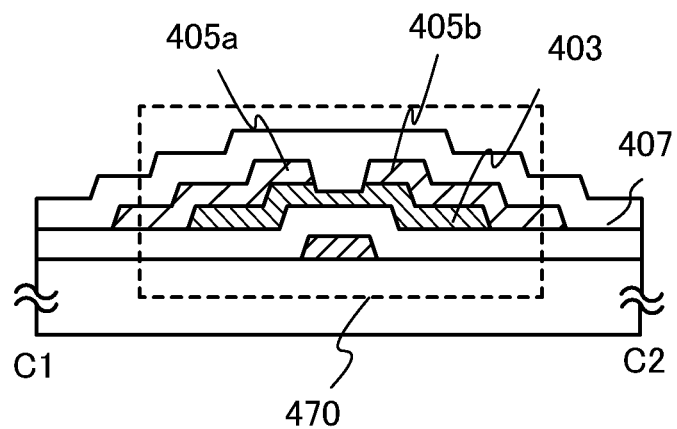

In FIG. 1A, the gate electrode layer 401 is provided over the substrate 400 having an insulating surface.

Although there is no particular limitation on a substrate which can be used as the substrate 400 having an insulating surface, it is necessary that the substrate have at least enough heat resistance to a heat treatment to be performed later. As the substrate 400 having an insulating surface, a glass substrate formed of barium borosilicate glass, aluminoborosilicate glass, or the like can be used.

In the case where a glass substrate is used and the temperature at which the heat treatment is to be performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than boric acid, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate. Alternatively, crystallized glass or the like can be used.

Further, an insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

As the material of the gate electrode layer 401, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the gate electrode layer 401 is selected as appropriate to be within the range of 30 nm to 200 nm. As a deposition method of the metal oxide used for the gate electrode layer 401, a sputtering method, a vacuum evaporation method (an electron beam evaporation method or the like), an arc discharge ion plating method or a spray method is used.

Next, the gate insulating layer 402 is formed over the gate electrode layer 401.

The gate insulating layer 402 can be formed to have a single-layer or stacked layer structure using a silicon oxide layer, a silicon nitride layer, a silicon oxynitride layer, or a silicon nitride oxide layer by a plasma CVD method, a sputtering method, or the like. For example, a silicon oxynitride layer may be formed using $SiH_4$, oxygen, and nitrogen as a film formation gas by a plasma CVD method.

Then, an oxide semiconductor film is formed to a thickness of greater than or equal to 2 nm and less than or equal to 200 nm over the gate insulating layer 402.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate to modify a surface. Note that instead of argon, nitrogen, helium, oxygen or the like may be used.

The oxide semiconductor film is formed by a sputtering method with use of an In—Ga—Zn—O-based oxide semiconductor target. Alternatively, the oxide semiconductor film can be formed by a sputtering method in a rare gas (typically argon) atmosphere, in an oxygen atmosphere, or in an atmosphere including a rare gas (typically argon) and oxygen.

The gate insulating layer 402 and the oxide semiconductor film may be formed successively without exposure to air. When the gate insulating layer 402 and the oxide semiconductor film are successively formed without exposure to air, the gate insulating layer 402 and the oxide semiconductor film can be formed without contamination of an interface thereof by atmospheric components or impurity elements floating in air, such as moisture or hydrocarbon. Therefore, variation in characteristics between the thin film transistors can be reduced.

Then, the oxide semiconductor film is processed into an oxide semiconductor layer (a first oxide semiconductor layer 430), which is an island-shaped oxide semiconductor layer, by a photolithography step (see FIG. 1A).

Next, the first oxide semiconductor layer 430 is dehydrated or dehydrogenated. A temperature at which a first heat treatment for dehydration or dehydrogenation is performed is greater than or equal to 350° C. and less than the strain point of the substrate, preferably greater than or equal to 400° C. Here, the substrate is introduced into an electric furnace which is one of heat treatment apparatuses and the first oxide semiconductor layer 430 is subjected to a heat treatment in an oxygen atmosphere; then, the slow cooling is performed in the oxygen atmosphere, whereby a second oxide semiconductor layer 431 is formed (see FIG. 1B). The slow cooling is performed from the heating temperature T at which the oxide semiconductor layer is dehydrated or dehydrogenated to a temperature low enough to prevent water from coming in again, specifically to a temperature which is more than 100° C. lower than the heating temperature T. Alternatively, the slow cooling is performed to a temperature lower than a temperature of a second heat treatment which is to be performed later and then the substrate is taken out of the heat treatment apparatus. The oxide semiconductor layer is subjected to the heat treatment in the oxygen atmosphere, whereby an impurity such as water contained in the oxide semiconductor layer can be removed and at the same time, the second oxide semiconductor layer 431 is placed into a state where oxygen is in excess. The oxide semiconductor layer is crystallized and changed into a microcrystalline film or a polycrystalline film in some cases depending on the condition of the first heat treatment or the material of the oxide semiconductor layer.

Note that in the first heat treatment, it is preferable that water, hydrogen, and the like be not contained in the oxygen gas. Alternatively, the purity of the oxygen gas which is introduced into the heat treatment apparatus is preferably greater than or equal to 6N (99.9999%) or more preferably greater than or equal to 7N (99.99999%) (that is, the impurity concentration in the oxygen is less than or equal to 1 ppm, or preferably less than or equal to 0.1 ppm).

The first heat treatment is performed for greater than or equal to 0.5 hours and less than or equal to 10 hours, where the rate of temperature increase of the electric furnace is preferably greater than or equal to 0.1° C./min and less than or equal to 20° C./min. Further, the rate of temperature decrease in the electric furnace is preferably greater than or equal to 0.1° C./min and less than or equal to 15° C./min.

As a result, the reliability of the thin film transistor to be formed later can be improved.

Further, instead of the heating method in which an electric furnace is used, a rapid heating method such as a gas rapid thermal anneal (GRTA) method using a heated gas or a lamp rapid thermal anneal (LRTA) method using lamp light can be used for the first heat treatment.

In the case where the heat treatment apparatus is a multi-chamber type, a chamber for the first heat treatment can be different from that for a cooling treatment. Typically, the oxide semiconductor layer over the substrate is heated in a first chamber which is filled with an oxygen gas and whose temperature is increased to greater than or equal to 400° C. and less than the strain point of the substrate. Then, through a transfer chamber into which an oxygen gas is introduced, the substrate on which the above first heat treatment is performed is transferred into a second chamber which is filled with oxygen and whose temperature is less than or equal to 100° C. or preferably room temperature, and is subjected to the cooling treatment. Through the above steps, throughput can be improved.

Alternatively, the oxide semiconductor film before being processed into the island-shaped oxide semiconductor layer can also be subjected to the first heat treatment in an oxygen atmosphere. In that case, after the first heat treatment and the cooling treatment of the oxide semiconductor film, the substrate is taken out of the heating device and a photolithography step is performed.

Before the oxide semiconductor film is formed, the gate insulating layer may be subjected to a heat treatment (at a temperature greater than or equal to 400° C. and less than the strain point of the substrate) in an inert gas (nitrogen or a rare gas such as helium, neon, or argon) atmosphere, in an oxygen atmosphere, or under a reduced pressure so that an impurity such as hydrogen and water in the layer is removed.

Next, a conductive film is formed over the gate insulating layer 402 and the second oxide semiconductor layer 431. As a deposition method of the conductive film, a sputtering method, a vacuum evaporation method (an electron beam evaporation method or the like), an arc discharge ion plating method, or a spray method is used.

As the material of the conductive film, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is selected as appropriate to be within the range of 30 nm to 200 nm.

Then, the second oxide semiconductor layer 431 and the conductive film are selectively etched by a photolithography step so as to form the oxide semiconductor layer 403, the source electrode layer 405a, and the drain electrode layer 405b. Note that only part of the oxide semiconductor layer is etched to be the oxide semiconductor layer having a groove (depression). When oxygen ashing is performed at the time of removing a resist mask which is used at this photolithography step, oxygen is introduced into an exposed region of the oxide semiconductor layer.

Figure 1C:
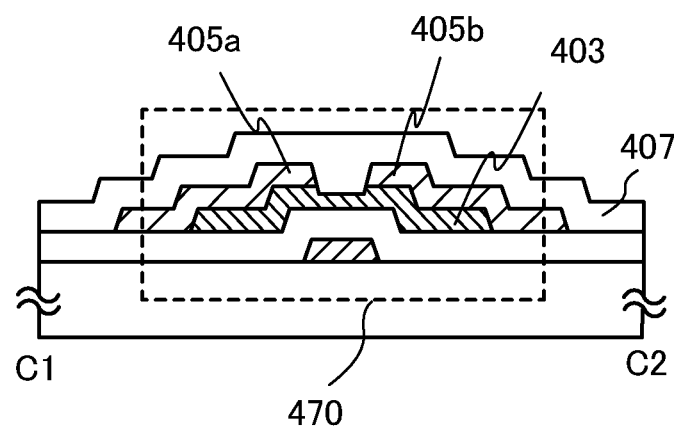

Next, the oxide insulating film 407 serving as a protective insulating layer is formed in contact with part of the oxide semiconductor layer 403, whereby the thin film transistor 470 can be manufactured (see FIG. 1C). The oxide insulating film 407 is formed to have a thickness of at least greater than or equal to 1 nm and can be appropriately formed by a method in which an impurity such as water or hydrogen is prevented from entering the oxide insulating film 407, for example, by a CVD method or a sputtering method. Here, the oxide insulating film 407 is formed by a sputtering method. The oxide insulating film 407, which is formed in contact with the low-resistance oxide semiconductor layer, does not contain an impurity such as moisture, a hydrogen ion, or OH⁻ and is formed using an inorganic insulating film which prevents intrusion of these from the outside. Typically, a silicon oxide film, a silicon nitride oxide film, an aluminum oxide film, or an aluminum oxynitride film is used. Alternatively, a silicon nitride film or an aluminum nitride film on and in contact with the oxide insulating film 407 may be formed. The silicon nitride film does not contain an impurity such as moisture, a hydrogen ion, or OH⁻ and prevents intrusion of these from the outside.

In this embodiment, a silicon oxide film with a thickness of 300 nm is formed as the oxide insulating film 407. A substrate temperature at the time of the film formation may be greater than or equal to room temperature and less than or equal to 300° C.; in this embodiment, the substrate temperature is 100° C. The silicon oxide film can be formed by a sputtering method in a rare gas (typically argon) atmosphere, in an oxygen atmosphere, or in an atmosphere including a rare gas (typically argon) and oxygen. As a target, a silicon oxide target or a silicon target can be used; for example, the silicon oxide film can be formed using a silicon target by a sputtering method in an atmosphere including oxygen and nitrogen.

Further, after the oxide insulating film 407 is formed, the thin film transistor 470 may be subjected to the second heat treatment (preferably at a temperature greater than or equal to 150° C. and less than 350° C.) in a nitrogen atmosphere or in an oxygen atmosphere. For example, the second heat treatment is performed in a nitrogen atmosphere at 250° C. for one hour. By the second heat treatment, the oxide semiconductor layer 403 is heated while being in contact with the oxide insulating film 407; thus, variation in electric characteristics of the thin film transistor 470 can be reduced.

Embodiment 2

A semiconductor device and a method for manufacturing a semiconductor device which are different from Embodiment 1 will be described with reference to FIGS. 3A to 3D. The portion that is identical to or has a function similar to those described in Embodiment 1 can be formed in a manner similar to that described in Embodiment 1; therefore, repetitive description is omitted.

Figure 3A:
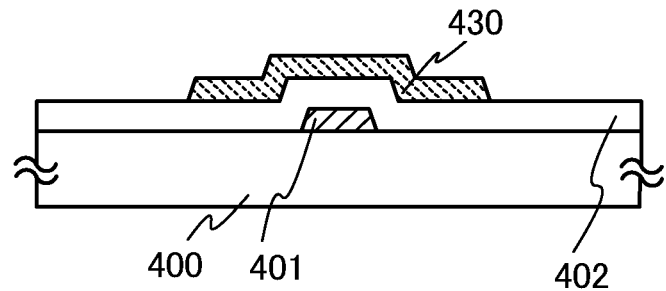
FIGS. 3A to 3D are cross-sectional views illustrating manufacturing steps of one embodiment of the present invention.
Figure 3B:
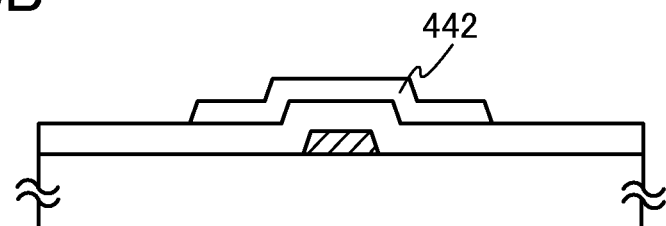
Figure 3C:
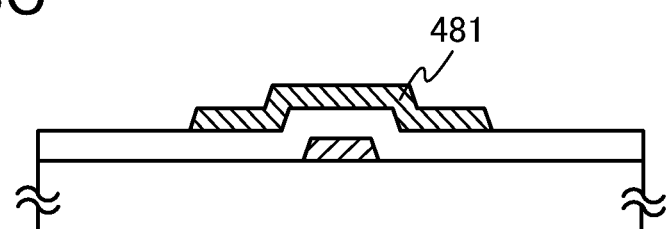
Figure 3D:
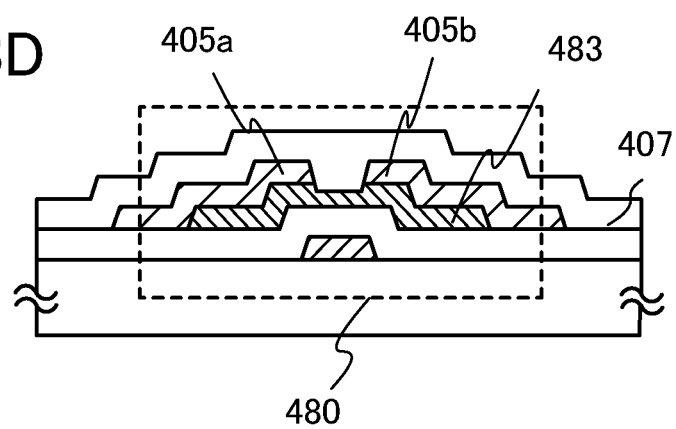

FIGS. 3A to 3D are cross-sectional views illustrating a manufacturing process of a thin film transistor 480. The structure of the thin film transistor 480 which is illustrated in FIG. 3D is called an inverted coplanar type (also called a bottom-contact type).

Similarly to Embodiment 1, the gate electrode layer 401 is provided over the substrate 400 having an insulating surface. An insulating film serving as a base film may be provided between the substrate 400 and the gate electrode layer 401.

Next, similarly to Embodiment 1, the gate insulating layer 402 is formed over the gate electrode layer 401. Then, an oxide semiconductor film is formed over the gate insulating layer 402.

The oxide semiconductor film is then processed into an oxide semiconductor layer (the first oxide semiconductor layer 430), which is an island-shaped oxide semiconductor layer, by a photolithography step (see FIG. 3A). Note that FIG. 3A is the same as FIG. 1A.

Next, the first oxide semiconductor layer 430 is dehydrated or dehydrogenated. A temperature at which a first heat treatment for dehydration or dehydrogenation is performed is greater than or equal to 350° C. and less than the strain point of the substrate, preferably greater than or equal to 400° C. Here, the substrate is introduced into an electric furnace which is one of heat treatment apparatuses and the first oxide semiconductor layer 430 is subjected to a heat treatment in an inert gas (nitrogen or a rare gas such as helium, neon, or argon) atmosphere or under a reduced pressure, whereby a second oxide semiconductor layer 442 is formed (see FIG. 3B). By the heat treatment in an inert gas atmosphere or under a reduced pressure, the resistance of the oxide semiconductor layer is reduced (a carrier concentration thereof is increased preferably to greater than or equal to $1 \times 10^{18}/cm^3$) and a low-resistance oxide semiconductor layer (the second oxide semiconductor layer 442) can be formed.

Note that in the first heat treatment, it is preferable that water, hydrogen, and the like be not contained in the nitrogen or the rare gas such as helium, neon, or argon. Alternatively, the purity of the nitrogen or the rare gas such as helium, neon, or argon which is introduced into the heat treatment apparatus is preferably greater than or equal to 6N, or more preferably greater than or equal to 7N (that is, the impurity concentration is less than or equal to 1 ppm, or preferably less than or equal to 0.1 ppm). In this embodiment, the dehydration or dehydrogenation is performed by heating the electric furnace, which has a nitrogen atmosphere and to which the substrate is introduced, to a temperature greater than or equal to 350° C. and less than or equal to 600° C., or preferably greater than or equal to 400° C.; then, introduction of the nitrogen or the rare gas is stopped and a heater is turned off.

After the heating, slow cooling is performed in an oxygen atmosphere so that a third oxide semiconductor layer 481 is formed (see FIG. 3C). The slow cooling is performed in an oxygen atmosphere from the heating temperature T at which the oxide semiconductor layer is dehydrated or dehydrogenated to a temperature low enough to prevent water from coming in again, specifically to a temperature more than 100° C. lower than the heating temperature T. Alternatively, the slow cooling is performed in an oxygen atmosphere to a temperature lower than a temperature of a second heat treatment which is to be performed later and then the substrate is taken out of the heat treatment apparatus. In this embodiment, the slow cooling is performed after the heater of the electric furnace is turned off and oxygen is introduced into the electric furnace. It is preferable that an impurity such as water or hydrogen be not contained in the introduced oxygen. Alternatively, the purity of the oxygen which is introduced into a chamber from a gas supply source is less than or equal to 6N, or preferably less than or equal to 7N (that is, the impurity concentration in the oxygen is less than or equal to 1 ppm, or preferably less than or equal to 0.1 ppm).

As a result, the reliability of the thin film transistor to be formed later can be improved.

Note that in the case where the first heat treatment is performed under a reduced pressure, cooling may be performed by introducing oxygen into the electric furnace after the heat treatment and returning the pressure to an atmospheric pressure.

In the case where the heat treatment apparatus is a multi-chamber type, a chamber for the first heat treatment can be different from that for a cooling treatment. Typically, the oxide semiconductor layer over the substrate is heated in a first chamber which is filled with nitrogen or a rare gas and whose temperature is increased to greater than or equal to 400° C. and less than the strain point of the substrate. Then, the slow cooling is performed to a temperature low enough to prevent water from coming in again, specifically to a temperature which is more than 100° C. lower than the heating temperature T. Next, through a transfer chamber into which nitrogen or a rare gas is introduced, the substrate on which the above first heat treatment is performed is transferred into a second chamber which is filled with oxygen and whose temperature is less than or equal to 100° C. or preferably room temperature, and is subjected to the cooling treatment. Through the above steps, throughput can be improved.

Alternatively, the oxide semiconductor film before being processed into the island-shaped oxide semiconductor layer can also be subjected to the first heat treatment in an inert gas atmosphere or under a reduced pressure. In that case, after the first heat treatment and the cooling treatment, the substrate is taken out of the heating device and a photolithography step is performed.

Before the oxide semiconductor film is formed, the gate insulating layer may be subjected to a heat treatment (at a temperature greater than or equal to 400° C. and less than the strain point of the substrate) in an inert gas (nitrogen or a rare gas such as helium, neon, or argon) atmosphere, in an oxygen atmosphere, or under a reduced pressure so that an impurity such as hydrogen and water in the layer is removed.

Then, a conductive film is formed over the gate insulating layer 402 and the third oxide semiconductor layer 481.

As the material of the conductive film, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is selected as appropriate to be within the range of 30 nm to 200 nm.

Then, the third oxide semiconductor layer 481 and the conductive film are selectively etched by a photolithography step so as to form an oxide semiconductor layer 483, the source electrode layer 405a and the drain electrode layer 405b. Note that only part of the oxide semiconductor layer is etched to be the oxide semiconductor layer having a groove (depression). When oxygen ashing is performed at the time of removing a resist mask which is used at this photolithography step, oxygen is introduced into an exposed region of the oxide semiconductor layer.

Next, the oxide insulating film 407 serving as a protective insulating layer is formed in contact with part of the oxide semiconductor layer 483, whereby the thin film transistor 480 can be manufactured (see FIG. 3D). The oxide insulating film 407 is formed to have a thickness of at least greater than or equal to 1 nm and can be appropriately formed by a method in which an impurity such as water or hydrogen is prevented from entering the oxide insulating film 407, for example, by a CVD method or a sputtering method. Here, the oxide insulating film 407 is formed by a sputtering method. The oxide insulating film 407, which is formed in contact with the low-resistance oxide semiconductor layer, does not contain an impurity such as moisture, a hydrogen ion, or OH$^-$ and is formed using an inorganic insulating film which prevents intrusion of these from the outside. Typically, a silicon oxide film, a silicon nitride oxide film, an aluminum oxide film, or an aluminum oxynitride film is used. Alternatively, a silicon nitride film or an aluminum nitride film on and in contact with the oxide insulating film 407 may be formed. The silicon nitride film does not contain an impurity such as moisture, a hydrogen ion, or OH$^-$ and prevents intrusion of these from the outside.

In this embodiment, a silicon oxide film with a thickness of 300 nm is formed as the oxide insulating film 407. A substrate temperature at the time of the film formation may be greater than or equal to room temperature and less than or equal to 300° C.; in this embodiment, the substrate temperature is 100° C. The silicon oxide film can be formed by a sputtering method in a rare gas (typically argon) atmosphere, in an oxygen atmosphere, or in an atmosphere including a rare gas (typically argon) and oxygen. As a target, a silicon oxide target or a silicon target can be used; for example, the silicon oxide film can be formed using a silicon target by a sputtering method in an atmosphere including oxygen and nitrogen.

Further, after the oxide insulating film 407 is formed, the thin film transistor 480 may be subjected to the second heat treatment (preferably at a temperature greater than or equal to 150° C. and less than 350° C.) in a nitrogen atmosphere or in an oxygen atmosphere. For example, the second heat treatment is performed in a nitrogen atmosphere at 250° C. for one hour. By the second heat treatment, the oxide semiconductor layer 483 is heated while being in contact with the oxide insulating film 407; thus, variation in electric characteristics of the thin film transistor 480 can be reduced.

This embodiment can be freely combined with Embodiment 1.

Embodiment 3

A semiconductor device and a method for manufacturing a semiconductor device which are different from Embodiments 1 and 2 will be described with reference to FIGS. 4A to 4C. The portion that is identical to or has a function similar to those described in Embodiments 1 and 2 can be formed in a manner similar to that described in Embodiments 1 and 2; therefore, repetitive description is omitted.

Figure 4A:
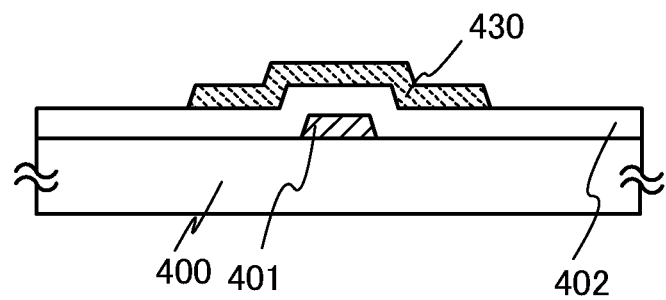
FIGS. 4A to 4C are cross-sectional views illustrating manufacturing steps of one embodiment of the present invention.
Figure 4B:
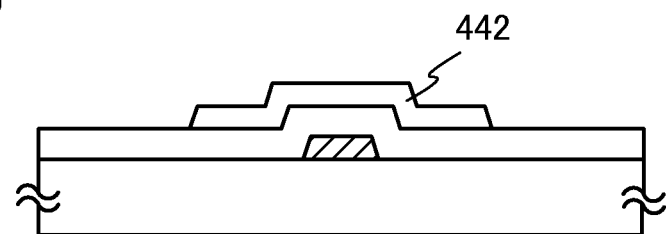
Figure 4C:
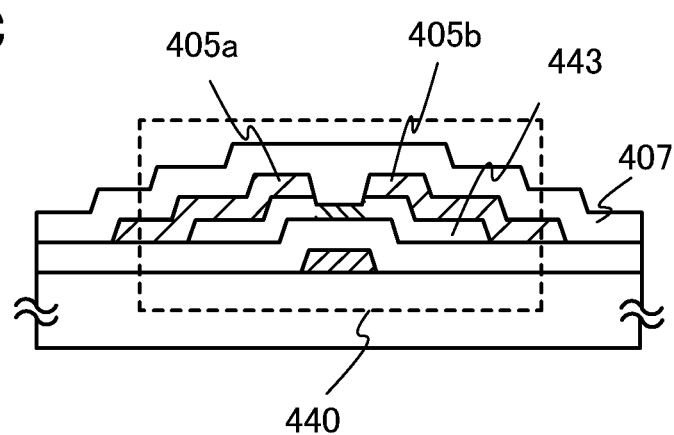

FIGS. 4A to 4C are cross-sectional views illustrating a manufacturing process of a thin film transistor 440. The structure of the thin film transistor 440 which is illustrated in FIG. 4C is called a channel stop type.

Similarly to Embodiment 1, the gate electrode layer 401 is provided over the substrate 400 having an insulating surface. An insulating film serving as a base film may be provided between the substrate 400 and the gate electrode layer 401.

Next, similarly to Embodiment 1, the gate insulating layer 402 is formed over the gate electrode layer 401. Then, an oxide semiconductor film is formed over the gate insulating layer 402.

Then, the oxide semiconductor film is processed into an oxide semiconductor layer (the first oxide semiconductor layer 430), which is an island-shaped oxide semiconductor layer, by a photolithography step (see FIG. 4A). Note that FIG. 4A is the same as FIG. 1A.

Next, the first oxide semiconductor layer 430 is dehydrated or dehydrogenated. A temperature at which a first heat treatment for dehydration or dehydrogenation is performed is greater than or equal to 350° C. and less than the strain point of the substrate, preferably greater than or equal to 400° C. Here, the substrate is introduced into an electric furnace which is one of heat treatment apparatuses and the first oxide semiconductor layer 430 is subjected to a heat treatment in an inert gas (nitrogen or a rare gas such as helium, neon, or argon) atmosphere or under a reduced pressure, whereby a second oxide semiconductor layer 444 is formed (see FIG. 4B).

Note that in the first heat treatment, it is preferable that water, hydrogen and the like be not contained in the nitrogen or the rare gas such as helium, neon, or argon. Alternatively, the purity of the nitrogen or the rare gas such as helium, neon, or argon which is introduced into the heat treatment apparatus is preferably greater than or equal to 6N (99.9999%) or more preferably greater than or equal to 7N (99.99999%) (that is, the impurity concentration is less than or equal to 1 ppm, or preferably less than or equal to 0.1 ppm). In this embodiment, the dehydration or dehydrogenation is performed by heating the electric furnace, which has a nitrogen atmosphere and to which the substrate is introduced, to a temperature greater than or equal to 350° C. and less than or equal to 600° C., or preferably greater than or equal to 400° C.; then, a heater is turned off and slow cooling is performed. By the heat treatment and the slow cooling in an inert gas atmosphere or under a reduced pressure, the resistance of the oxide semiconductor layer is reduced (a carrier concentration thereof is increased preferably to greater than or equal to $1 \times 10^{18}/cm^3$) and a low-resistance oxide semiconductor layer (the second oxide semiconductor layer 444) can be formed.

Note that in the case where the heat treatment is performed under a reduced pressure, cooling may be performed by introducing an inert gas into the electric furnace after the heat treatment and returning the pressure to an atmospheric pressure.

In the case where the heat treatment apparatus is a multi-chamber type, a chamber for the heat treatment can be different from that for a cooling treatment. Typically, the oxide semiconductor layer over the substrate is heated in a first chamber which is filled with nitrogen or a rare gas and whose temperature is increased to greater than or equal to 200° C. and less than or equal to 600° C., or preferably greater than or equal to 400° C. and less than or equal to 450° C. Then, the slow cooling is performed to a temperature low enough to prevent water from coming in again, specifically to a temperature more than 100° C. lower than the heating temperature T. Next, through a transfer chamber into which nitrogen or a rare gas is introduced, the substrate on which the above heat treatment is performed is transferred into a second chamber which is filled with nitrogen or a rare gas and whose temperature is less than or equal to 100° C. or preferably room temperature, and is subjected to the cooling treatment. Through the above steps, throughput can be improved.

Alternatively, the oxide semiconductor film before being processed into the island-shaped oxide semiconductor layer can also be subjected to the heat treatment in an inert gas atmosphere or under a reduced pressure. In that case, after the oxide semiconductor film is subjected to the heat treatment in the inert gas atmosphere or under a reduced pressure, the slow cooling to a temperature greater than or equal to room temperature and less than 100° C. is performed; then, the substrate is taken out of the heating device and a photolithography step is performed.

Before the oxide semiconductor film is formed, the gate insulating layer may be subjected to a heat treatment (at a temperature greater than or equal to 400° C. and less than the strain point of the substrate) in an inert gas (nitrogen or a rare gas such as helium, neon, or argon) atmosphere, in an oxygen atmosphere, or under a reduced pressure so that an impurity such as hydrogen and water in the layer is removed.

Then, a conductive film is formed over the gate insulating layer 402 and the second oxide semiconductor layer 444.

As the material of the conductive film, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is selected as appropriate to be within the range of 30 nm to 200 nm.

Then, the second oxide semiconductor layer 444 and the conductive film are selectively etched by a photolithography step so as to form the oxide semiconductor layer, the source electrode layer 405a, and the drain electrode layer 405b. Note that only part of the oxide semiconductor layer is etched to be the oxide semiconductor layer having a groove (depression). When oxygen ashing is performed at the time of removing a resist mask which is used at this photolithography step, oxygen is introduced into an exposed region of the oxide semiconductor layer.

Next, the oxide insulating film 407 serving as a protective insulating layer is formed in contact with part of the oxide semiconductor layer. The oxide insulating film 407 is formed to have a thickness of at least greater than or equal to 1 nm and can be appropriately formed by a method in which an impurity such as water or hydrogen is prevented from entering the oxide insulating film 407, for example, by a CVD method or a sputtering method. Here, the oxide insulating film 407 is formed by a sputtering method. The oxide insulating film 407, which is formed in contact with the low-resistance oxide semiconductor layer, does not contain an impurity such as moisture, a hydrogen ion, or OH⁻ and is formed using an inorganic insulating film which prevents intrusion of these from the outside. Typically, a silicon oxide film, a silicon nitride oxide film, an aluminum oxide film, or an aluminum oxynitride film is used. Alternatively, a silicon nitride film or an aluminum nitride film on and in contact with the oxide insulating film 407 may be formed. The silicon nitride film does not contain an impurity such as moisture, a hydrogen ion, or OH⁻ and prevents intrusion of these from the outside.

By forming the oxide insulating film 407 in contact with the low-resistance second oxide semiconductor layer 444 by a sputtering method, a PCVD method, or the like, resistance is increased at least in a region of the low-resistance oxide semiconductor layer 444, which is in contact with the oxide insulating film 407 (a carrier concentration thereof is decreased to preferably less than $1 \times 10^{18}/cm^3$), and thus the region can be a high-resistance oxide semiconductor region. Further, the resistance of regions of the low-resistance oxide semiconductor layer 444 which overlap with the source electrode layer 405a and the drain electrode layer 405b, is still low, and thus two low-resistance oxide semiconductor regions with the high-resistance oxide semiconductor region therebetween are obtained. It is important to increase and decrease the carrier concentration of the oxide semiconductor layer by the heating in an inert gas atmosphere (or under a reduced pressure), the slow cooling, the formation of the oxide insulating film, and the like during the manufacturing process of the semiconductor device. The oxide semiconductor layer 444 becomes an oxide semiconductor layer 443 (a third oxide semiconductor layer) which has the high-resistance oxide semiconductor region and the low-resistance oxide semiconductor regions, and the thin film transistor 440 can be formed. Note that the high-resistance oxide semiconductor region serves as a channel formation region of the thin film transistor 440.

Note that by forming the low-resistance oxide semiconductor regions in the oxide semiconductor layer 443 which overlap with the drain and source electrode layers, reliability can be increased when a drive circuit is formed. Specifically, by forming the low-resistance oxide semiconductor regions, a structure is realized in which the drain electrode layer, the low-resistance oxide semiconductor region, and the channel formation region can vary in conductivity in this order. Thus, in a transistor which operates while being connected to a wiring which supplies the drain electrode layer with a high power source potential VDD, the low-resistance oxide semiconductor region serves as a buffer so that a local high electric field is not applied even when a high electric field is applied between the gate electrode layer and the drain electrode layer; in this manner, the transistor can have a structure with an increased withstand voltage.

In addition, by forming the low-resistance oxide semiconductor regions in the oxide semiconductor layer 443 which overlap with the drain and source electrode layers, leakage current in the channel formation region can be reduced when a drive circuit is formed. Specifically, by forming the low-resistance oxide semiconductor regions, leakage current flowing between the drain electrode layer and the source electrode layer passes through the drain electrode layer, the low-resistance oxide semiconductor region on the drain electrode layer side, the channel formation region, the low-resistance oxide semiconductor region on the source electrode layer side, and the source electrode layer in this order. At this time, the leakage current which flows from the low-resistance oxide semiconductor region on the drain electrode layer side to the channel formation region can be concentrated in the vicinity of the interface between the gate insulating layer and the channel formation region, which has high resistance when the transistor is turned off, whereby the leakage current at a back channel portion (part of the surface of the channel formation region which is apart from the gate electrode layer) can be reduced.

Further, after the oxide insulating film 407 is formed, the thin film transistor 440 may be subjected to a second heat treatment (preferably at a temperature greater than or equal to 150° C. and less than 350° C.) in a nitrogen atmosphere or in an oxygen atmosphere. For example, the second heat treatment is performed in a nitrogen atmosphere at 250° C. for one hour. By the second heat treatment, the oxide semiconductor layer 443 is heated while being in contact with the oxide insulating film 407; thus, variation in electric characteristics of the thin film transistor 440 can be reduced.

This embodiment can be freely combined with Embodiment 1 or 2.

Embodiment 4

A semiconductor device and a method for manufacturing the semiconductor device are described with reference to FIGS. 5A to 5C and FIGS. 6A and 6B.

Figure 6A:
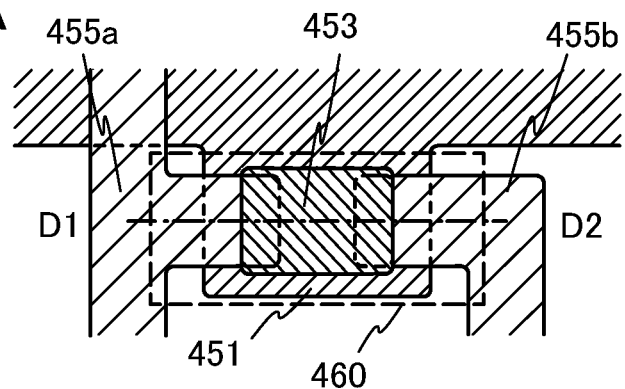
FIGS. 6A and 6B are a plan view and a cross-sectional view, respectively, illustrating one embodiment of the present invention.
Figure 6B:
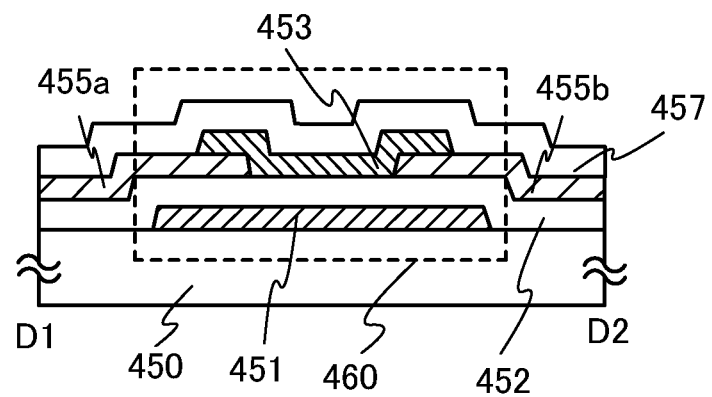

FIG. 6A is a plan view of a thin film transistor 460 included in a semiconductor device, and FIG. 6B is a cross-sectional view taken along line D1-D2 of FIG. 6A. The thin film transistor 460 is a bottom gate thin film transistor and includes, over a substrate 450 having an insulating surface, a gate electrode layer 451, a gate insulating layer 452, a source electrode layer 455a, a drain electrode layer 455b, and an oxide semiconductor layer 453. In addition, an oxide insulating film 457 is provided to cover the thin film transistor 460 and be in contact with the oxide semiconductor layer 453. An In—Ga—Zn—O-based non-single-crystal film is used for the oxide semiconductor layer 453.

In the thin film transistor 460, the gate insulating layer 452 exists in the entire region including the thin film transistor 460, and the gate electrode layer 451 is provided between the gate insulating layer 452 and the substrate 450 which is a substrate having an insulating surface. The source electrode layer 455a and the drain electrode layer 455b are provided over the gate insulating layer 452. Further, the oxide semiconductor layer 453 is provided over the gate insulating layer 452, the source electrode layer 455a and the drain electrode layer 455b. Although not illustrated, a wiring layer is provided over the gate insulating layer 452 in addition to the source electrode layer 455a and the drain electrode layer 455b, and the wiring layer extends beyond the peripheral portion of the oxide semiconductor layer 453.

The substrate 450 having an insulating surface, the gate electrode layer 451, the gate insulating layer 452, the oxide semiconductor layer 453, the source electrode layer 455a, the drain electrode layer 455b, and the oxide insulating film 457 are all formed using a material having a visible light transmitting property. Thus, the thin film transistor 460 has a light transmitting property and an aperture ratio can be improved in the case where the thin film transistor 460 is placed in a pixel portion of a display device.

The oxide semiconductor layer 453 is subjected to a heat treatment (a heat treatment for dehydration or dehydrogenation) for reducing moisture and the like which are impurities and slow cooling at least after the oxide semiconductor film is formed; then, the oxide insulating film 457 is formed in contact with the oxide semiconductor layer 453. In this manner, the oxide semiconductor film is used as a channel formation region.

Figure 5A:
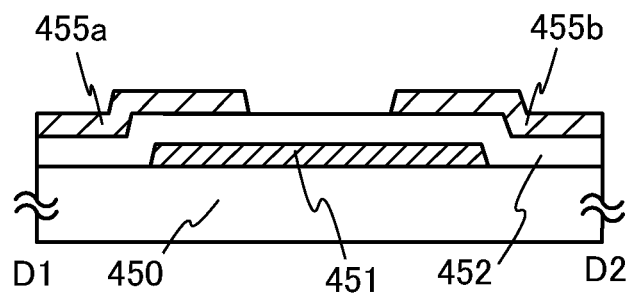
FIGS. 5A to 5C are cross-sectional views illustrating manufacturing steps of one embodiment of the present invention.
Figure 5B:
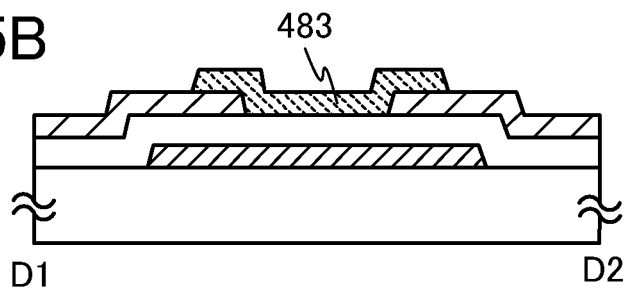
Figure 5C:
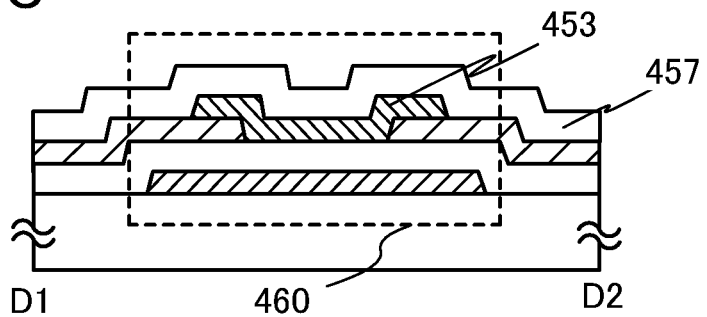

FIGS. 5A to 5C are cross-sectional views illustrating steps of manufacturing the thin film transistor 460 which is illustrated in FIG. 6B.

The gate electrode layer 451 is provided over the substrate 450 which is a substrate having an insulating surface. Further, an insulating film serving as a base film may be provided between the substrate 450 and the gate electrode layer 451. The base film has a function of preventing diffusion of an impurity element from the substrate 450, and can be formed to have a single-layer or stacked-layer structure using one or more of a silicon nitride film, a silicon oxide film, a silicon nitride oxide film, and a silicon oxynitride film.

As the material of the gate electrode layer 451, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the gate electrode layer 451 is selected as appropriate to be within the range of 30 nm to 200 nm.

Next, the gate insulating layer 452 is formed over the gate electrode layer 451.

The gate insulating layer 452 can be formed to have a single-layer or stacked layer structure using a silicon oxide layer, a silicon nitride layer, a silicon oxynitride layer, or a silicon nitride oxide layer by a plasma CVD method, a sputtering method, or the like. For example, a silicon oxynitride layer may be formed using $SiH_4$, oxygen, and nitrogen as a film formation gas by a plasma CVD method.

Then, a conductive film is formed over the gate insulating layer 452 and processed into the island-shaped source electrode layer 455a and the island-shaped drain electrode layer 455b by a photolithography step (see FIG. 5A).

As the material of the conductive film, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is selected as appropriate to be within the range of 30 nm to 200 nm.

Then, an oxide semiconductor film is formed over the gate insulating layer 452, the source electrode layer 455a and the drain electrode layer 455b, and processed into an island-shaped oxide semiconductor layer 483 (the first oxide semiconductor layer) by a photolithography step (see FIG. 5B). When oxygen ashing is performed at the time of removing a resist mask which is used at this photolithography step, oxygen is introduced into an exposed region of the oxide semiconductor layer.

Note that before the oxide semiconductor film is formed by a sputtering method, dust on a surface of the gate insulating layer 452 is preferably removed by reverse sputtering in which an argon gas is introduced and plasma is generated.

The oxide semiconductor layer 483 is subjected to the first heat treatment for dehydration or dehydrogenation. A temperature at which the first heat treatment for dehydration or dehydrogenation is performed is greater than or equal to 350° C. and less than the strain point of the substrate, preferably greater than or equal to 400° C.

As the first heat treatment for dehydration or dehydrogenation, a heat treatment in an inert gas (nitrogen or a rare gas such as helium, neon, or argon) atmosphere, in an oxygen atmosphere, or under a reduced pressure is performed. After that, the slow cooling is performed from the heating temperature T at which the oxide semiconductor layer is dehydrated or dehydrogenated to a temperature low enough to prevent water from coming in again, specifically to a temperature which is more than 100° C. lower than the heating temperature T. Alternatively, the slow cooling is performed to a temperature lower than a temperature of a second heat treatment which is to be performed later and then the substrate is taken out of the heat treatment apparatus.

In this embodiment, similarly to Embodiment 1, the oxide semiconductor layer 453 in which impurities such as moisture in the layer are reduced is formed by the first heat treatment performed in an oxygen atmosphere and the slow cooling performed in the oxygen atmosphere. There is no particular limitation on the combination of the first heat treatment and the slow cooling, and the combination and order described in any one of Embodiments 1 to 3 can be used.

Note that in the first heat treatment, it is preferable that water, hydrogen, and the like be not contained in the inert gas (nitrogen or a rare gas such as helium, neon, or argon) atmosphere or in the oxygen atmosphere. Alternatively, the purity of the gas which is introduced into the heat treatment apparatus is preferably greater than or equal to 6N (99.9999%) or more preferably greater than or equal to 7N (99.99999%) (that is, the impurity concentration in the atmosphere is less than or equal to 1 ppm, or preferably less than or equal to 0.1 ppm).

As a result, the reliability of the thin film transistor to be formed later can be improved.

Alternatively, the oxide semiconductor film before being processed into the island-shaped oxide semiconductor layer can also be subjected to the first heat treatment in an oxygen atmosphere. In that case, after the first heat treatment and the cooling treatment of the oxide semiconductor film, the substrate is taken out of the heating device and a photolithography step is performed.

Before the oxide semiconductor film is formed, the gate insulating layer may be subjected to a heat treatment (at a temperature greater than or equal to 400° C. and less than the strain point of the substrate) in an inert gas (nitrogen or a rare gas such as helium, neon, or argon) atmosphere, in an oxygen atmosphere, or under a reduced pressure so that an impurity such as hydrogen and water in the layer is removed.

Next, the oxide insulating film 457 is formed in contact with the oxide semiconductor layer 453 by a sputtering method or a PCVD method, whereby the thin film transistor 460 can be manufactured (see FIG. 5C). In this embodiment, a silicon oxide film with a thickness of 300 nm is formed as the oxide insulating film 457. A substrate temperature at the time of the film formation may be greater than or equal to room temperature and less than or equal to 300° C.; in this embodiment, the substrate temperature is 100° C.

Further, after the oxide insulating film 457 is formed, the thin film transistor 460 may be subjected to the second heat treatment (preferably at a temperature greater than or equal to 150° C. and less than 350° C.) in a nitrogen atmosphere or in an oxygen atmosphere. For example, the second heat treatment is performed at 250° C. for one hour in a nitrogen atmosphere. By the second heat treatment, the oxide semiconductor layer 453 is heated while being in contact with the oxide insulating film 457; thus, variation in electric characteristics of the thin film transistor 460 can be reduced.

This embodiment can be freely combined with Embodiment 1, 2, or 3.

Embodiment 5

In this embodiment, an example of a channel stop type thin film transistor 1430 is described with reference to FIGS. 7A to 7C. An example of a plan view of a thin film transistor is illustrated in FIG. 7C, a cross-sectional view taken along dotted line Z1-Z2 of which corresponds to FIG. 7B. This embodiment is an example in which gallium is not included in an oxide semiconductor layer of the thin film transistor 1430.

First, a gate electrode layer 1401 is provided over a substrate 1400.

Additionally, an insulating film serving as a base film may be provided between the substrate 1400 and the gate electrode layer 1401. The base film has a function of preventing diffusion of an impurity element from the substrate 1400, and can be formed to have a single-layer or stacked-layer structure using one or more of a silicon nitride film, a silicon oxide film, a silicon nitride oxide film, and a silicon oxynitride film.

As the material of the gate electrode layer 1401, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the gate electrode layer 1401 is selected as appropriate to be within the range of 30 nm to 200 nm.

Next, a gate insulating layer 1402 is formed so as to cover the gate electrode layer 1401. An oxide semiconductor layer is formed over the gate insulating layer 1402.

In this embodiment, the oxide semiconductor layer is formed using a Sn—Zn—O-based oxide semiconductor by a sputtering method. When gallium is not used for the oxide semiconductor layer, use of an expensive target in formation of the oxide semiconductor layer can be avoided, so that cost can be reduced.

Just after deposition of an oxide semiconductor film or after being processed into an island-shaped oxide semiconductor layer, dehydration or dehydrogenation is performed.

As the first heat treatment for dehydration or dehydrogenation, a heat treatment in an inert gas (nitrogen or a rare gas such as helium, neon, or argon) atmosphere, in an oxygen atmosphere, or under a reduced pressure is performed. A temperature at which the first heat treatment is performed is greater than or equal to 350° C. and less than the strain point of the substrate, preferably greater than or equal to 400° C. After that, slow cooling is performed from the heating temperature T at which the oxide semiconductor layer is dehydrated or dehydrogenated to a temperature low enough to prevent water from coming in again, specifically to a temperature which is more than 100° C. lower than the heating temperature T. Alternatively, the slow cooling is performed to a temperature lower than a temperature of a second heat treatment which is to be performed later and then the substrate is taken out of the heat treatment apparatus.

Figure 7A:
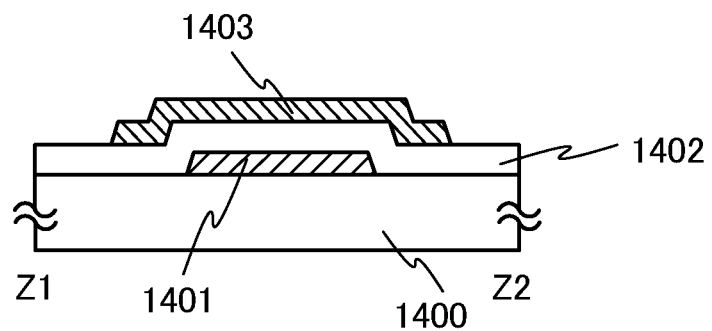
FIGS. 7A and 7B are cross-sectional views illustrating manufacturing steps of one embodiment of the present invention.

In this embodiment, similarly to Embodiment 1, an oxide semiconductor layer 1403 in which impurities such as moisture in the layer are reduced is formed by the first heat treatment performed in an oxygen atmosphere and the slow cooling performed in the oxygen atmosphere (see FIG. 7A). There is no particular limitation on the combination of the first heat treatment and the slow cooling, and the combination and order described in any one of Embodiments 1 to 3 can be used.

Note that in the first heat treatment, it is preferable that water, hydrogen and the like be not contained in the inert gas (nitrogen or a rare gas such as helium, neon, or argon) atmosphere or in the oxygen atmosphere. Alternatively, the purity of the gas which is introduced into the heat treatment apparatus is preferably greater than or equal to 6N or more preferably greater than or equal to 7N (that is, the impurity concentration in the atmosphere is less than or equal to 1 ppm, or preferably less than or equal to 0.1 ppm).

As a result, the reliability of the thin film transistor to be formed later can be improved.

Alternatively, the oxide semiconductor film before being processed into the island-shaped oxide semiconductor layer can also be subjected to the first heat treatment in an oxygen atmosphere. In that case, after the first heat treatment and the cooling treatment of the oxide semiconductor film, the substrate is taken out of the heating device and a photolithography step is performed.

Before the oxide semiconductor film is formed, the gate insulating layer may be subjected to a heat treatment (at a temperature greater than or equal to 400° C. and less than the strain point of the substrate) in an inert gas (nitrogen or a rare gas such as helium, neon, or argon) atmosphere, in an oxygen atmosphere, or under a reduced pressure so that an impurity such as hydrogen and water in the layer is removed.

Next, a channel protective layer 1418 is provided on and in contact with the oxide semiconductor layer 1403. By providing the channel protective layer 1418, damage to a channel formation region of the oxide semiconductor layer 1403 (e.g., a reduction in thickness due to plasma or an etchant in etching) can be prevented in the manufacturing process. Thus, the thin film transistor 1430 can have improved reliability.

Further, the channel protective layer 1418 can be successively formed without exposure to air after the heat treatment for dehydration or dehydrogenation. Successive film formation without exposure to air makes it possible to form the oxide semiconductor layer 1403 and the channel protective layer 1418, the interface of which is not contaminated by atmospheric components or impurity elements floating in air, such as moisture or hydrocarbon. Therefore, variation in characteristics between the thin film transistors can be reduced.

The channel protective layer 1418 can be formed using an inorganic material which contains oxygen (e.g., silicon oxide, silicon oxynitride, or silicon nitride oxide). As a method for forming the channel protective layer 1418, a vapor deposition method such as a plasma CVD method or a thermal CVD method or a sputtering method can be used. After the formation of the channel protective layer 1418, the shape thereof is processed by etching. Here, the channel protective layer 1418 is formed in such a manner that a silicon oxide film is formed by a sputtering method and processed by etching using a mask formed by photolithography. When oxygen ashing is performed at the time of removing a resist mask which is used at this photolithography step, oxygen is introduced into an exposed region of the oxide semiconductor layer.

Then, a conductive film is formed over the channel protective layer 1418 and the oxide semiconductor layer 1403.

As the material of the conductive film, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is selected as appropriate to be within the range of 30 nm to 200 nm.

Figure 7B:
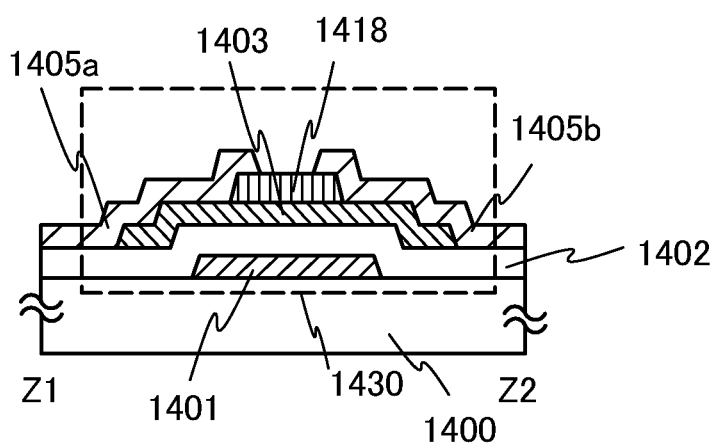
Figure 7C:
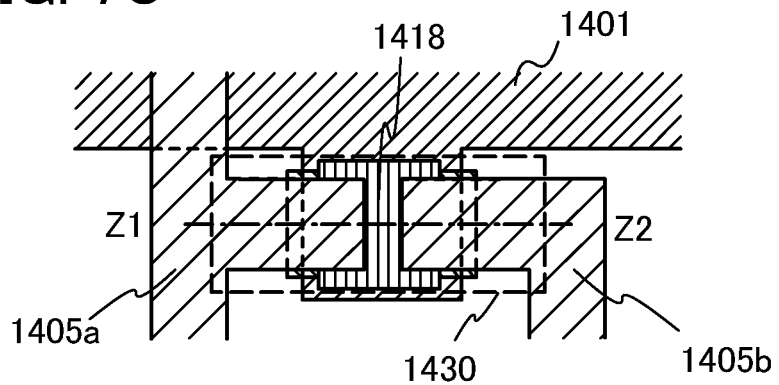
FIG. 7C is a plan view illustrating one embodiment of the present invention.

Next, the conductive film is selectively etched using a mask formed by photolithography so as to form a source electrode layer 1405*a* and a drain electrode layer 1405*b* over the channel protective layer 1418 and the oxide semiconductor layer 1403; thus, the thin film transistor 1430 is manufactured (see FIG. 7B).

This embodiment can be freely combined with Embodiment 1, 2, or 3.

Embodiment 6

In this embodiment, a manufacturing example of a liquid crystal display device in which the thin film transistor described in Embodiment 1 is placed in a pixel portion is described with reference to FIGS. 8A to 8D, FIGS. 9A to 9C, FIG. 10, FIG. 11, FIGS. 12A to 12D, FIGS. 13A to 13C, FIGS. 14A and 14B, and FIG. 15.

In FIG. 8A, a glass substrate formed of barium borosilicate glass, aluminoborosilicate glass, or the like can be used as a substrate 100 having a light transmitting property. As the substrate 100 having a light transmitting property, a large-area substrate having a size of, for example, 1000 mm×1200 mm, 1100 mm×1250 mm, or 1150 mm×1300 mm may be used. When such a large-area substrate is used, a plurality of liquid crystal display devices can be manufactured using one substrate and the manufacturing cost can be reduced. In this embodiment, a glass substrate having a size of 600 mm×720 mm is used.

Next, after a conductive film having a visible light transmitting property is formed over an entire surface of the substrate 100, a first photolithography step is performed. to form a resist mask, and unnecessary portions of the conductive film are removed by etching to form wirings and an electrode (a gate wiring including a gate electrode layer 101, a capacitor wiring 108, and a first terminal 121). At this time, the etching is performed so that at least end portions of the gate electrode layer 101 have a tapered shape.

In the case of using a large-area substrate, instead of using an expensive photomask for a photolithography, a resist mask may be formed by an ink-jet method. When the resist mask is formed by an ink-jet method, the manufacturing cost can be reduced. Note that a resist mask may be formed by an ink-jet method in at least one step of the photolithography process below in order to reduce the manufacturing cost.

As the material of the gate wiring including the gate electrode layer 101, the capacitor wiring 108, and the first terminal 121 of a terminal portion, a conductive material having a visible light transmitting property such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Each thickness of the gate wiring including the gate electrode layer 101, the capacitor wiring 108, and the first terminal 121 of a terminal portion is selected as appropriate to be within the range of 30 nm to 200 nm. As a deposition method of the conductive film, a sputtering method, a vacuum evaporation method (an electron beam evaporation method or the like), an arc discharge ion plating method, a spray method, or an ink-jet method is used. In the case of forming the conductive film by an ink-jet method, the photolithography step becomes unnecessary and a further cost reduction can be achieved.

In this embodiment, as the conductive film, an In—Sn—O-based conductive film is formed using an In—Sn—O-based target by a sputtering method. The conductive film may be subjected to a heat treatment in order to have low resistance after being formed. The target is formed by attaching a target material to a backing plate (a board for attaching a target thereto). As for the attachment of the target to the backing plate, the target may be divided and attached to one backing plate. When the target is divided, warpage of the target can be relaxed in the attachment of the target to the backing plate. In particular, when the thin film is formed over a large substrate, such divided targets can be suitably used for a target which is upsized in accordance with the size of the large substrate. Needless to say, one target may be attached to one backing plate.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a gate insulating layer 102 is formed over the entire surface of the gate electrode layer 101. The gate insulating layer 102 is formed to a thickness of greater than or equal to 50 nm and less than or equal to 250 nm by a sputtering method, a PCVD method, or the like. The gate insulating layer 102 is formed to have a single-layer structure or a stacked-layer structure using an inorganic insulating film such as a silicon oxide film, a silicon oxynitride film, a silicon nitride oxide film, a silicon nitride film, or a tantalum oxide film.

In this embodiment, the gate insulating layer 102 having a thickness of 100 nm is formed over the gate electrode layer 101 in the following manner: a monosilane gas ($SiH_4$), nitrous oxide ($N_2O$), and a rare gas are introduced into a chamber of a high-density plasma apparatus as source gases, and high density plasma is generated under a pressure of 10 Pa to 30 Pa. The gate insulating layer 102 is a silicon oxynitride film. In this embodiment, the high-density plasma apparatus refers to an apparatus which can realize a plasma density of greater than or equal to $1 \times 10^{11}/cm^3$. For example, plasma is generated by applying a microwave power of 3 kW to 6 kW so that the insulating film is formed. When the insulating film is formed, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the gate insulating layer 102 formed with the high-density plasma apparatus has a uniform thickness, the gate insulating layer 102 has excellent step coverage. Further, by forming the insulating film using the high-density plasma apparatus, the thickness of the insulating film can be controlled precisely.

The insulating film obtained with the high-density plasma apparatus is greatly different from an insulating film formed with a conventional parallel plate PCVD apparatus. The insulating film obtained with the high-density plasma apparatus has an etching rate which is lower than that of the insulating film formed with the conventional parallel plate PCVD apparatus by greater than or equal to 10% or greater than or equal to 20% in the case where the etching rates with the same etchant are compared to each other. Thus, it can be said that the insulating film obtained with the high-density plasma apparatus is a dense film.

Next, an oxide semiconductor film (an In—Ga—Zn—O-based non-single-crystal film) is formed over the gate insulating layer 102. It is effective to form the In—Ga—Zn—O-based non-single-crystal film without exposure to air after the plasma treatment because dust or moisture can be prevented from being attached to an interface between the gate insulating layer and the semiconductor film. Here, the oxide semiconductor film is formed in an oxygen atmosphere, in an argon atmosphere, or in an atmosphere including argon and oxygen under the conditions where a target is an oxide semiconductor target containing In, Ga, and Zn (an In—Ga—Zn—O-based oxide semiconductor target ($In_2O_3$: $Ga_2O_3$:ZnO=1:1:1)) with a diameter of 8 inches, the distance between the substrate and the target is 170 mm, the pressure is 0.4 Pa, and the direct current (DC) power supply is 0.5 kW. Note that use of a pulse direct current (DC) power supply is preferable because this can reduce dust and make the film thickness uniform. The In—Ga—Zn—O-based non-single-crystal film is formed to have a thickness of 2 nm to 200 nm. As the oxide semiconductor film, an In—Ga—Zn—O-based non-single-crystal film with the thickness of 50 nm is formed using the In—Ga—Zn—O-based oxide semiconductor target by a sputtering method. The oxide semiconductor film preferably has a thickness of less than or equal to 50 nm in order to be kept amorphous. Especially in a channel-etched thin film transistor, the oxide semiconductor film is further etched so that a small-thickness region, i.e., a channel formation region, has a thickness less than or equal to 30 nm and a small-thickness region of the completed thin film transistor has a thickness greater than or equal to 5 nm and less than or equal to 20 nm. In addition, it is preferable that the channel width of the completed thin film transistor be greater than or equal to 0.5 μm and less than or equal to 10 μm.

A target is formed by attaching a target material to a backing plate (a board for attaching a target thereto) and vacuum packing. In formation of the oxide semiconductor layer, in order to obtain excellent electric characteristics of a thin film transistor, it is preferable that the backing plate including the target material attached thereto be set in a sputtering apparatus while being kept away from moisture and the like in the air as much as possible. It is preferable that the target be kept away from moisture and the like in the air as much as possible not only at the time of setting the target material to the sputtering apparatus, but also during the period up to vacuum-packing, during which manufacturing the target, attaching the target materials to the backing plate, and the like are performed.

Next, a second photolithography step is performed to form a resist mask, and then the oxide semiconductor film is etched. For example, unnecessary portions are removed by wet etching using a mixed solution of phosphoric acid, acetic acid, and nitric acid, so that a first oxide semiconductor layer 133 is formed (see FIG. 8A). Note that etching here is not limited to wet etching and dry etching may also be performed.

As an etching gas for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on the substrate side, the temperature of the electrode on the substrate side, or the like) are adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may also be used.

The etchant used in the wet etching is removed by cleaning together with the material which is etched off. The waste liquid including the etchant and the material etched off may be purified to recycle the materials contained in the waste liquid. When a material such as indium included in the oxide semiconductor layer is collected from the waste liquid after the etching and reused, the resources can be efficiently used and thus the cost can be reduced.

The etching conditions (such as an etchant, etching time, and temperature) are adjusted as appropriate depending on the material so that the film can be etched into a desired shape.

The first oxide semiconductor layer 133 is subjected to a first heat treatment for dehydration or dehydrogenation. After the first oxide semiconductor layer 133 is subjected to the first heat treatment in an oxygen atmosphere, slow cooling in the oxygen atmosphere is performed.

The first heat treatment is performed at a temperature of 650° C. in an oxygen atmosphere for one hour, for example. The slow cooling is performed from the heating temperature T at which the oxide semiconductor layer is dehydrated or dehydrogenated to a temperature low enough to prevent water from coming in again, specifically to a temperature which is more than 100° C. lower than the heating temperature T so that a second oxide semiconductor layer 134 is formed. Alternatively, the slow cooling is performed to a temperature lower than a temperature of a second heat treatment which is to be performed later and then the substrate is taken out of the heat treatment apparatus. The oxide semiconductor layer is subjected to the heat treatment in the oxygen atmosphere, whereby an impurity such as water contained in the oxide semiconductor layer can be removed and at the same time, the second oxide semiconductor layer 134 is placed into a state where oxygen is in excess (see FIG. 8B). The oxide semiconductor layer is crystallized and changed into a microcrystalline film or a polycrystalline film in some cases depending on the condition of the first heat treatment or the material of the oxide semiconductor layer.

Then, a conductive film 132 having a light transmitting property is formed over the second oxide semiconductor layer 134 by a sputtering method, a vacuum evaporation method (an electron beam evaporation method or the like), an arc discharge ion plating method, a spray method, or an ink-jet method (see FIG. 8C).

A conductive material having a visible light transmitting property such as the following materials can be employed as the material of the conductive film 132 having a light transmitting property: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film 132 having a light transmitting property is selected as appropriate to be within the range of 30 nm to 200 nm.

In this embodiment, an example is described in which the first heat treatment for dehydration or dehydrogenation is performed before the conductive film 132 having a light transmitting property is formed; however, the present invention is not particularly limited thereto and the first heat treatment may be performed after the conductive film 132 having a light transmitting property is formed. When the first heat treatment is performed after the conductive film 132 having a light transmitting property is formed, the oxide semiconductor layer can be dehydrated or dehydrogenated and at the same time, the conductive film 132 having a light transmitting property can have improved crystallinity and low resistance by this heat treatment.

Next, a third photolithography step is performed to form a resist mask and then unnecessary portions are etched away, so that a source electrode layer 105a, a drain electrode layer 105b, a capacitor electrode 135, and a second terminal 122 are formed. Wet etching or dry etching is employed as an etching method at this time. In this etching step, an exposed region of the oxide semiconductor layer is partly etched so that an oxide semiconductor layer 103 having a depression is formed. Therefore, a region of the oxide semiconductor layer 103, which does not overlap with the source electrode layer 105a and the drain electrode layer 105b has a small thickness. In FIG. 8D, the etching for forming the source electrode layer 105a, the drain electrode layer 105b and the oxide semiconductor layer is performed at a time by dry etching. Accordingly, end portions of the oxide semiconductor layer 103 and the source electrode layer 105a are aligned with each other and are continuous while end portions of the oxide semiconductor layer 103 and the drain electrode layer 105b are aligned with each other and are continuous (these end portions are located above the gate electrode layer 101).

In the third photolithography step, the second terminal 122 which is formed using the same material as the source electrode layer 105a or the drain electrode layer 105b is left in the terminal portion. Note that the second terminal 122 is electrically connected to a source wiring (a source wiring including the source electrode layer 105a).

In addition, in the third photolithography step, a storage capacitor is formed by the capacitor wiring 108 and the capacitor electrode 135 which is formed using the same material as the source electrode layer 105a or the drain electrode layer 105b using the gate insulating layer 102 as a dielectric.

Further, with use of a resist mask having regions with a plurality of thicknesses (typically, two different thicknesses) which is formed using a multi-tone mask, the number of resist masks can be reduced, which realizes a simplified process and lower cost.

Next, the resist mask is removed. When oxygen ashing is performed at the time of removing the resist mask, oxygen is introduced into an exposed region of the oxide semiconductor layer 103. Then, a first protective insulating layer 107 serving as a protective insulating layer is formed in contact with part of the oxide semiconductor layer 103. The first protective insulating layer 107 is formed using, typically a silicon oxide film, a silicon oxynitride film, an aluminum oxide film, an aluminum oxynitride film or the like. Needless to say, the first protective insulating layer 107 is an insulating film having a light transmitting property.

Then, a heat treatment may be performed after the first protective insulating layer 107 is formed. The heat treatment may be performed at a temperature greater than or equal to 150° C. and less than 350° C. in an oxygen atmosphere or in a nitrogen atmosphere. By the heat treatment, the oxide semiconductor layer 103 is heated while being in contact with the first protective insulating layer 107; thus, the oxide semiconductor layer 103 can be made to have a higher resistance, whereby electric characteristics of the transistor can be improved and variation in electric characteristics of the transistor can be reduced. The timing of this heat treatment (at a temperature greater than or equal to 150° C. and less than or equal to 350° C., preferably) is not particularly limited as long as it is after the formation of the first protective insulating layer 107. When this heat treatment also serves as a heat treatment in another step, e.g., a heat treatment in formation of a resin film or a heat treatment for reducing the resistance of a conductive film having a light transmitting property, the number of steps can be prevented from increasing.

Through the above steps, a thin film transistor 170 can be completed.

After that, a second protective insulating layer 131 is formed (see FIG. 9A). The second protective insulating layer 131 is formed using an inorganic insulating film containing no impurities such as moisture, a hydrogen ion, or OH$^-$, which prevents intrusion of these from the outside; typically, a silicon nitride film, an aluminum nitride film, a silicon nitride oxide film, an aluminum oxynitride film or the like is used. Needless to say, the second protective insulating layer 131 is an insulating film having a light transmitting property.

Further, the second protective insulating layer 131 is preferably in contact with the gate insulating layer 102 or an insulating film serving as a base which is provided below the second protective insulating layer 131, whereby intrusion of an impurity such as moisture, a hydrogen ion, or OH$^-$ from a side surface of the substrate is prevented. The above structure is effective particularly when a silicon nitride film is used for the gate insulating layer 102 or the insulating film serving as a base which is in contact with the second protective insulating layer 131.

Next, a fourth photolithography step is performed to form a resist mask. The first protective insulating layer 107, the second protective insulating layer 131, and the gate insulating layer 102 are etched to form a contact hole 125 that reaches the drain electrode layer 105b. In addition, a contact hole 127 that reaches the second terminal 122 and a contact hole 126 that reaches the first terminal 121 are also formed in the same etching step. A cross-sectional view at this stage is illustrated in FIG. 9B. Note that FIG. 10 is a plan view at this stage and cross-sectional views taken along dotted lines A1-A2 and B1-B2 of which correspond to FIG. 9B. In addition, as illustrated in FIG. 10, a contact hole 124 that reaches the capacitor electrode 135 is also formed in the same etching step.

Next, the resist mask is removed, and then a conductive film having a light transmitting property is formed. The conductive film having a light transmitting property is formed using indium oxide (In$_2$O$_3$), indium oxide-tin oxide alloy (In$_2$O$_3$—SnO$_2$, abbreviated to ITO), or the like by a sputtering method, a vacuum evaporation method, or the like. An Al—Zn—O-based non-single-crystal film including nitrogen, examples of which are an Al—Zn—O—N-based non-single-crystal film, a Zn—O—N-based non-single-crystal film including nitrogen, and a Sn—Zn—O—N-based non-single-crystal film including nitrogen, may be used as the conductive film. Note that the relative proportion (atomic %) of zinc in an Al—Zn—O—N-based oxide semiconductor film is less than or equal to 47 atomic % and is larger than the relative proportion (atomic %) of aluminum in the oxide semiconductor film. The relative proportion (atomic %) of aluminum in the oxide semiconductor film is larger than the relative proportion (atomic %) of nitrogen in the conductive film having a light transmitting property. Such a material is etched with a hydrochloric acid-based solution. However, since a residue is easily generated particularly in etching ITO, indium oxide-zinc oxide alloy (In$_2$O$_3$—ZnO) may be used to improve etching processability. Further, when a heat treatment for reducing the resistance of the conductive film having a light transmitting property is performed, the heat treatment can serve as a heat treatment for increasing resistance of the oxide semiconductor layer 103, which results in improvement of electric characteristics of the transistor and reduction of variation in the electric characteristics thereof.

Next, a fifth photolithography step is performed to form a resist mask. Then, an unnecessary portion is etched away, so that a pixel electrode layer 110 is formed. Note that the pixel electrode layer 110 is electrically connected to the capacitor electrode 135 through the contact hole which is formed in the first protective insulating layer 107 and the second protective insulating layer 131.

In addition, in the fifth photolithography step, the first terminal 121 and the second terminal 122 are covered with the resist mask, and conductive films 128 and 129 having light transmitting properties are left in the terminal portions. The conductive films 128 and 129 having light transmitting properties serve as an electrode or a wiring connected to an FPC. The conductive film 128 having a light transmitting property which is formed over the first terminal 121 is a connection terminal electrode which functions as an input terminal of the gate wiring. The conductive film 129 having a light transmitting property which is formed over the second terminal 122 is a connection terminal electrode serving as an input terminal of a source wiring.

Figure 11:
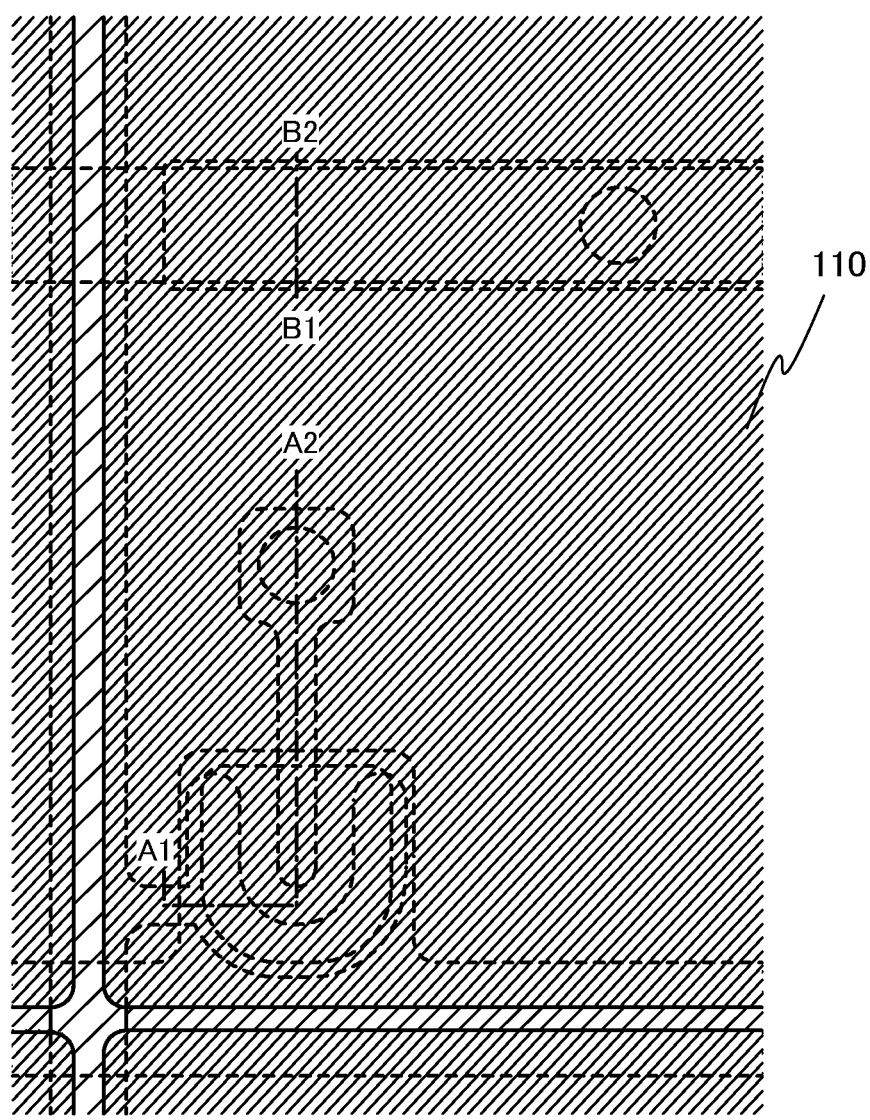
FIG. 11 is a plan view illustrating one embodiment of the present invention.

Then, the resist mask is removed. A cross-sectional view at this stage is illustrated in FIG. 9C. A plan view at this stage is illustrated in FIG. 11, cross-sectional vies taken along dotted lines A1-A2 and B1-B2 of which correspond to FIG. 9C. Although an example is described in which the pixel electrode layer 110 overlaps with the channel formation region and the gate electrode layer 101 of the thin film transistor 170 to which the pixel electrode layer 110 is electrically connected, the present invention is not particularly limited thereto and the channel formation region of the thin film transistor 170 may overlap with a pixel electrode layer of an adjacent pixel, which is not electrically connected to the channel formation region. When the conductive film having a light transmitting property, which is the pixel electrode layer 110 here, is formed so as to overlap with the channel formation region of the thin film transistor 170, in a bias-temperature stress test (hereinafter, referred to as a BT test) for examining reliability of a thin film transistor, the amount of change in threshold voltage of the thin film transistor 170 between before and after the BT test can be reduced.

Figure 12A:
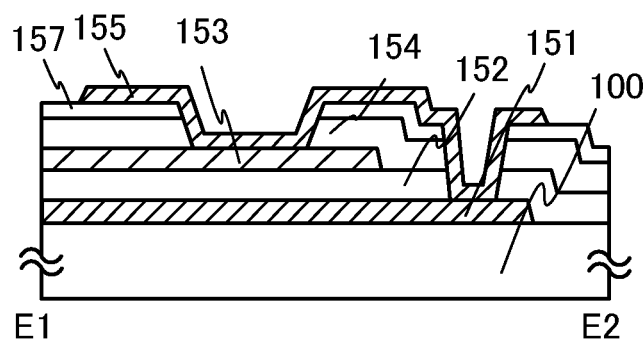
FIGS. 12A and 12C are cross-sectional views and FIGS. 12B and 12D are plan views illustrating one embodiment of the present invention.
Figure 12B:
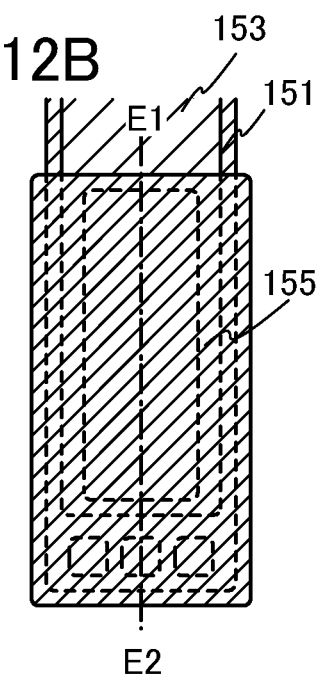

FIGS. 12A and 12B are respectively a cross-sectional view and a plan view of a gate wiring terminal portion at this stage. FIG. 12A is a cross-sectional view taken along line E1-E2 of FIG. 12B. In FIG. 12A, a conductive film 155 having a light transmitting property which is formed over a first protective insulating layer 154 and a second protective insulating layer 157 is a connection terminal electrode which functions as an input terminal. Furthermore, in the terminal portion of FIG. 12A, a first terminal 151 formed of the same material as the gate wiring and a connection electrode layer 153 formed of the same material as the source wiring overlap with each other with a gate insulating layer 152 interposed therebetween, and are electrically connected to each other through the conductive film 155 having a light transmitting property. Note that the portion where the conductive film 128 having a light transmitting property is in contact with the first terminal 121 in FIG. 9C corresponds to a portion where the conductive film 155 having a light transmitting property is in contact with the first terminal 151 in FIG. 12A.

Figure 12C:
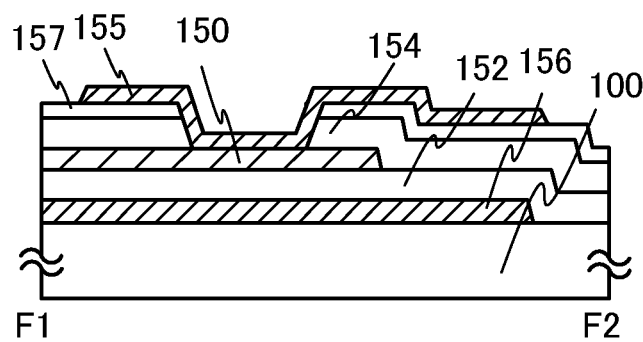
Figure 12D:
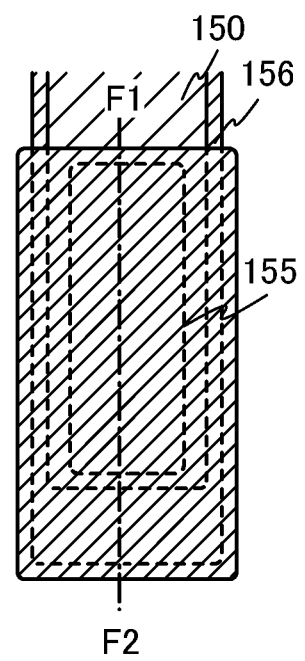

FIGS. 12C and 12D are respectively a cross-sectional view and a plan view of a source wiring terminal portion which is different from that illustrated in FIG. 9C. FIG. 12C is a cross-sectional view taken along line F1-F2 of FIG. 12D.

In FIG. 12C, the conductive film 155 having a light transmitting property which is formed over the first protective insulating layer 154 and the second protective insulating layer 157 is a connection terminal electrode which functions as an input terminal. Furthermore, in the terminal portion of FIG. 12C, an electrode layer 156 formed of the same material as the gate wiring is located below a second terminal 150 electrically connected to the source wiring and overlaps with the second terminal 150 with the gate insulating layer 152 therebetween. The electrode layer 156 is not electrically connected to the second terminal 150, and a capacitor to prevent noise or static electricity can be formed if the potential of the electrode layer 156 is set to a potential different from that of the second terminal 150, such as floating, GND, or 0 V. Further, the second terminal 150 is electrically connected to the conductive film 155 having a light transmitting property with the first protective insulating layer 154 and the second protective insulating layer 157 therebetween.

A plurality of gate wirings, source wirings, and capacitor wirings are provided depending on the pixel density. Also in the terminal portion, the first terminal at the same potential as the gate wiring, the second terminal at the same potential as the source wiring, a third terminal at the same potential as the capacitor wiring, and the like are each arranged in plurality. The number of each of the terminals may be any number, and the number of the terminals may be determined by a practitioner as appropriate.

Through these five photolithography steps, the storage capacitor and a pixel thin film transistor portion including the thin film transistor 170 of a bottom-gate staggered thin film transistor can be completed using the five photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Alternatively, a structure of a storage capacitor is not limited to that described in this embodiment; for example, instead of providing the capacitor wiring, the pixel electrode layer may overlap with a gate wiring of an adjacent pixel with the protective insulating layer and the gate insulating layer interposed therebetween, so that a storage capacitor is formed.

Figure 13A:
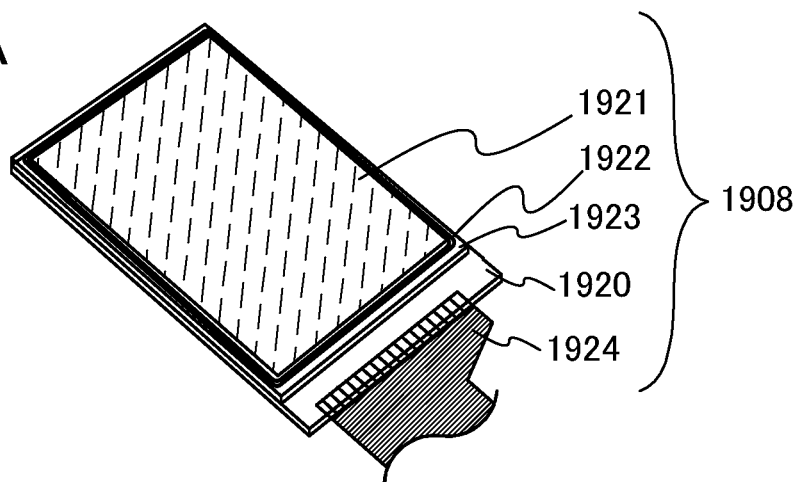
FIGS. 13A to 13C are perspective views illustrating one embodiment of the present invention.
Figure 13B:
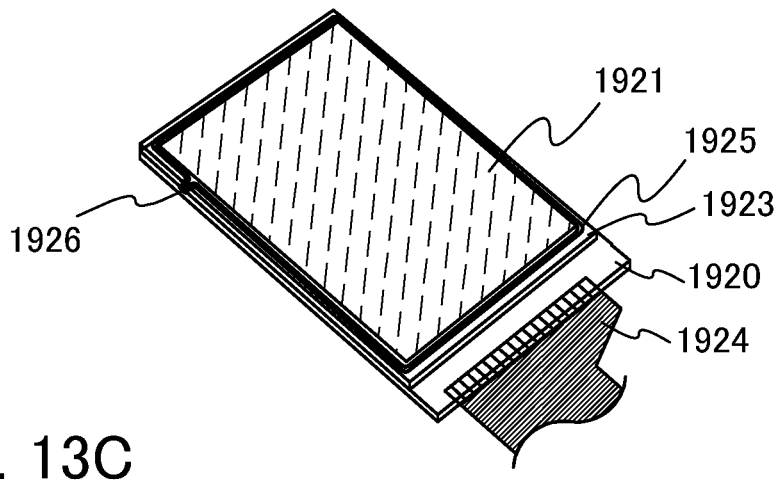
Figure 13C:
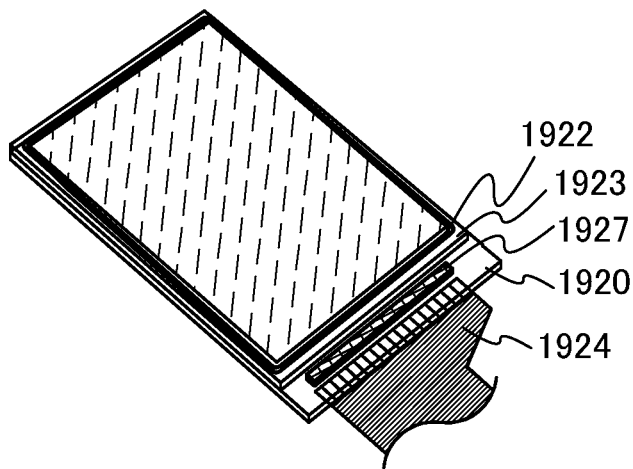

As a method by which a liquid crystal layer is provided between an active matrix substrate and a counter substrate and sealed, there are a liquid crystal dripping method, a liquid crystal injection method, and the like. FIGS. 13A to 13C illustrate an example of a liquid crystal panel in which a liquid crystal layer is provided between the active matrix substrate and the counter substrate, and an FPC 1924 is attached. In a display panel 1908 of FIG. 13A, a first substrate 1920 for which a pixel electrode layer is provided and a second substrate 1923 facing the first substrate 1920 are attached to each other with a sealant 1922. The sealant 1922 is formed so as to surround a display portion 1921. A liquid crystal layer is provided in a region surrounded by the first substrate 1920, the second substrate 1923, and the sealant 1922. In the display panel 1908 illustrated in FIG. 13A, liquid crystal is sealed by utilizing a liquid crystal dripping method, and attaching the substrates under a reduced pressure. The gap between the pair of substrates is maintained with a spacer; specifically, a spherical spacer, a columnar spacer, a filler in a sealant, or the like. Note that the spacer may be selected as appropriate depending on a liquid crystal mode (a TN mode, a VA mode, an IPS mode, or the like) for driving the display panel 1908. Note that although the second substrate is not always provided with an electrode in an IPS mode, in other liquid crystal modes the second substrate is often provided with a counter electrode; and in such a case, when the pair of substrates is attached, connection for electrically connecting the counter electrode to a terminal electrode provided on the first substrate is also carried out.

FIG. 13B illustrates a structural example of a panel manufactured utilizing a method of sealing liquid crystal which differs from that of FIG. 13A. Note that in FIG. 13B, portions which are the same as those in FIG. 13A are denoted by the same reference numerals as those used in FIG. 13A. In the display panel illustrated in FIG. 13B, liquid crystal is injected through an inlet for injecting liquid crystal which is formed by a first sealant 1925, using a liquid crystal injecting method or the like, and then the inlet for injecting liquid crystal is sealed by a second sealant 1926.

FIG. 13C illustrates a structural example of a panel which differs from that of FIG. 13A. In FIG. 13C, portions which are the same as those in FIG. 13A are denoted by the same reference numerals as those used in FIG. 13A. In a panel in FIG. 13C, a driver IC 1927 for driving a display portion is mounted on the first substrate 1920, so that circuits are integrated.

A desired optical film such as a polarizer, an anti-reflection film, or a color filter may be provided, as appropriate, for the display panels illustrated in FIGS. 13A to 13C, if necessary.

Figure 14A:
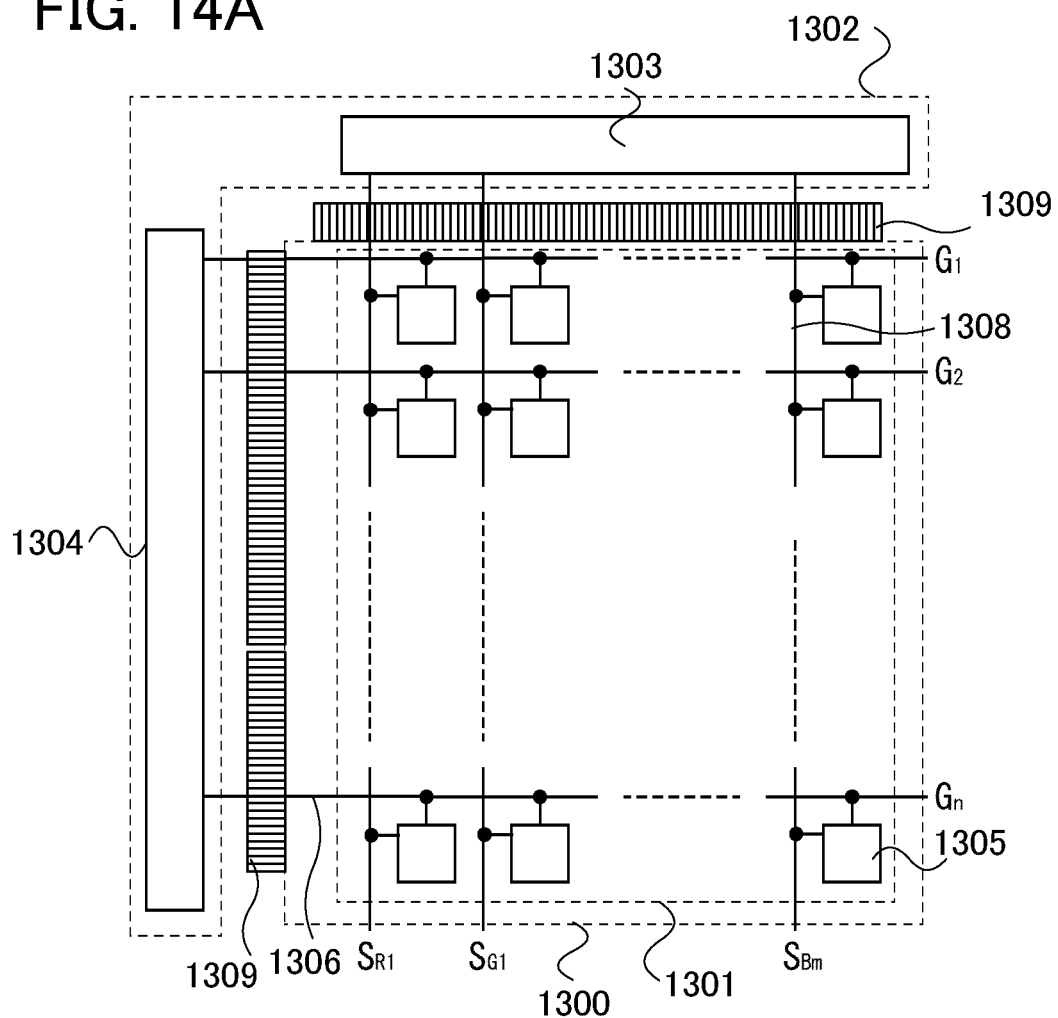
FIGS. 14A and 14B are block diagrams illustrating one embodiment of the present invention.
Figure 14B:
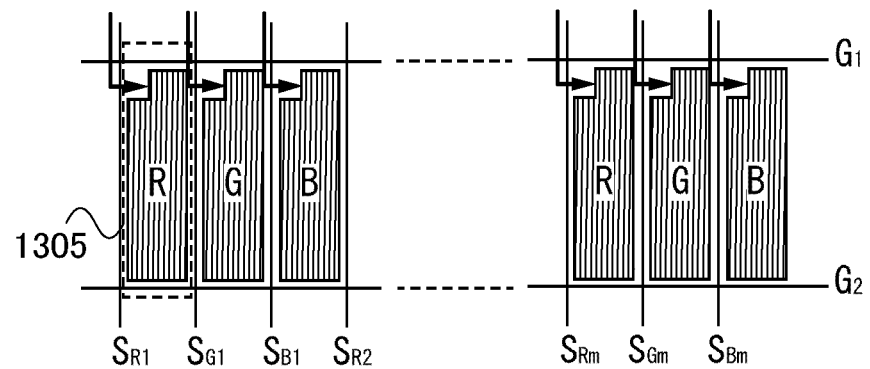

Block diagrams in FIGS. 14A and 14B shows a structure of an active matrix liquid crystal display device which corresponds to FIG. 13C. In FIG. 14A, a structure of a display portion 1301 which is provided over a substrate 1300 and a driving portion 1302 which is connected to the outside of the substrate 1300 is illustrated. The driving portion 1302 includes a signal line driver circuit 1303, a scan line driver circuit 1304, and the like. In the display portion 1301, a plurality of pixels 1305 is provided in matrix.

In FIG. 14A, a scan signal is supplied from the scan line driver circuit 1304 to a scan line 1306 through an external connection terminal 1309. In addition, data is supplied from the signal line driver circuit 1303 to a signal line 1308 through the external connection terminal 1309. A scan signal from the scan line 1306 is supplied in such a manner that the pixels 1305 are sequentially selected from a first row of the scan line 1306.

Note that in this embodiment, the driving portion 1302 is formed outside of the substrate 1300 and can be mounted on an FPC (flexible printed circuit) by a TAB (tape automated bonding) method. Alternatively, the driving portion 1302 can be mounted on the substrate 1300 by a chip on glass (COG) method.

Note that the driving portion 1302 is formed outside of the substrate 1300 and formed using a transistor which uses a single crystal semiconductor in this embodiment. Therefore, advantages such as improvement in driving frequency, low power consumption by a reduction in driving voltage, and suppression of variations in output signals can be obtained in the driving portion 1302. Note also that a signal, voltage, current, or the like is input from the scan line driver circuit 1304 and the signal line driver circuit 1303 through the external connection terminal 1309.

In FIG. 14A, the scan line driver circuit 1304 is connected to n scan lines 1306 $G_1$ to $G_n$. Considering the case where the minimum image unit is composed of three pixels of R (red), G (green), and B (blue), the signal line driver circuit 1303 is connected to 3·m signal lines in total: m signal lines $S_{R1}$ to $S_{Rm}$ corresponding to R; m signal lines $S_{G1}$ to $S_{Gm}$ corresponding to G, and m signal lines $S_{B1}$ to $S_{Bm}$ corresponding to B. That is, as illustrated in FIG. 14B, each color element is provided with a signal line and data is supplied from the signal line to the pixel corresponding to each color element, so that the pixels 1305 can express a desired color.

Figure 15:
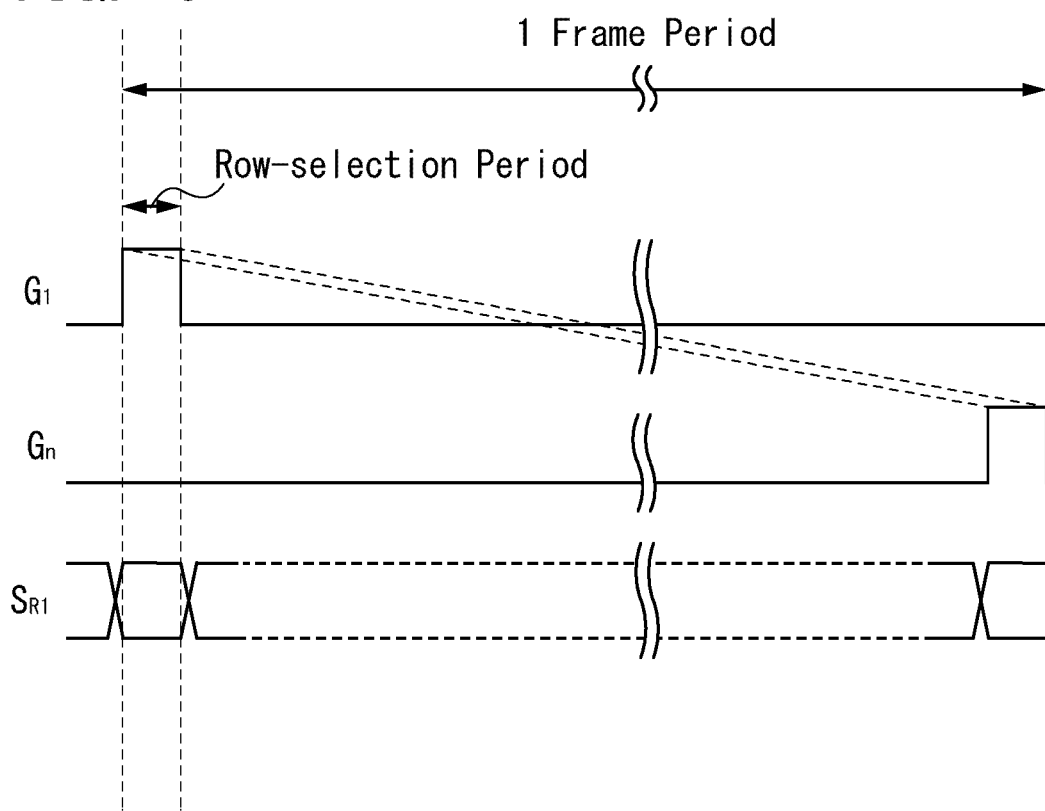
FIG. 15 is a timing chart illustrating one embodiment of the present invention.

A timing chart of FIG. 15 illustrates scan signals for selecting the scan lines 1306 (e.g., $G_1$ and $G_n$) in the respective row-selection periods (scan period of one row of pixels of the display device) in one frame period, and a data signal of the signal line 1308 (e.g., $SR_1$).

Note that block diagrams in FIGS. 14A and 14B, each pixel is provided with the thin film transistor 170, which is an n-channel transistor. Also in FIG. 15, description is made on the driving of a pixel in the case of controlling on or off of an n-channel transistor.

In the timing chart of FIG. 15, a row-selection period is 1/(120×n) second on the assumption that one frame period during which an image of one screen is displayed is set to at least 1/120 second (≈8.3 ms) (more preferably, 1240 second) so that an afterimage is not visible to an observer and the number of scan lines is set to n. In the case of a display device including 2000 scan lines (considering so-called 4k2k images with 4096×2160 pixels, 3840×2160 pixels, or the like), a row-selection period is 1/240000 second (≈4.2 μs) if signal delay or the like due to a wiring is not taken into consideration.

Since the thin film transistor 170 which is arranged in each pixel has a light transmitting property, a high aperture ratio can be realized even when the number of scan lines is increased to, for example, 2000.

In an active matrix liquid crystal display device (for example, a TN type liquid crystal display device), pixel electrode layers arranged in a matrix form are driven to form a display pattern on a screen. Specifically, voltage is applied between a selected pixel electrode layer and a counter electrode corresponding to the pixel electrode layer, and thus, a liquid crystal layer disposed between the pixel electrode layer and the counter electrode is optically modulated. This optical modulation is recognized as a display pattern by a viewer.

In the TN-type liquid crystal display device, liquid crystal is arranged in a twisted state at 900 between the pair of the substrates, and the absorption axis direction of the polarizing element is arranged in approximately parallel or perpendicular to the rubbing direction. In such a TN-type liquid crystal display device, when no voltage is applied to the pixel electrode layer, incident light from a light source such as a backlight becomes linear polarization in a polarizing element on the light source side, and this linear polarization is transmitted along the twist of the liquid crystal layer. In addition, when the transmission axis of the other polarizing element is aligned with an azimuth of the linear polarization, the linear polarization is all emitted to display white (normally white display).

Further, in the case of a full-color liquid crystal display device, a color filter is provided and color display is performed when no voltage is applied to the pixel electrode layer. Alternatively, when a voltage is applied to the pixel electrode layer, incident light from a light source becomes linear polarization in the polarizing element on the light source side, and the direction of a unit vector showing an average orientation direction of a liquid crystal molecule axis included in the liquid crystal layer is the approximately perpendicular to the substrate surface. Therefore, the linear polarization is transmitted without changing of an azimuth thereof on the light source side, and the azimuth is aligned with the absorption axis of the other polarizing element, and black display is obtained.

In this embodiment, an example of the TN-type liquid crystal display device is shown; however, it is not particularly limited, and the present invention can be applied to various modes of liquid crystal display devices. For example, as a method for improving viewing angle characteristics, the present invention can be applied to a lateral electric field method (also referred to as IPS) in which an electric field in the horizontal direction to the main surface of the substrate is applied to the liquid crystal layer. In addition, the present invention can be applied to a method in which a vertical alignment film is used as an alignment film with the use of a nematic liquid crystal material having negative dielectric anisotropy as a liquid crystal material. This method in which the vertical alignment film is used is one of voltage control birefringence (also referred to as ECB) methods, and transmittance is controlled utilizing birefringence of the liquid crystal molecules.

As a method for improving response speed, response speed of the liquid crystal layer may be improved so as to response a moving image with the use of ferroelectric liquid crystal and antiferroelectric liquid crystal.

Alternatively, a liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase appears within an only narrow range of temperature, a liquid crystal composition containing a chiral agent at greater than or equal to 5 wt % so as to improve the temperature range is used for the liquid crystal layer. The liquid crystal composition which includes a liquid crystal showing a blue phase and a chiral agent has a short response time of less than or equal to 1 msec, has optical isotropy, which makes the alignment process unneeded, and has a small viewing angle dependence.

Further, the present invention can be applied to a transmission-type liquid crystal display device in which an OCB (optical compensate birefringence) mode is employed. The OCB mode improves response speed of a liquid crystal layer by the liquid crystal layer between a pair of substrates being made to be in a state referred to as bend alignment. A pretilt angle of the first alignment film in contact with the liquid crystal layer and a pretilt angle of the second alignment film in contact with the liquid crystal layer are reversed, whereby the bend alignment is made. In this OCB mode, the liquid crystal layer is needed to be transferred from splay alignment that is an initial state to the bend alignment state.

Furthermore, the present invention can be applied to a transmission-type liquid crystal display device in which a vertical alignment mode is employed. In the transmission-type liquid crystal display device in which the vertical alignment mode is employed, one pixel is set to be a plurality of sub-pixels, and a projection portion is provided in an opposite substrate positioned in a center part of each of sub-pixels, whereby orientation division (multi-domain) of one pixel is performed; accordingly, a driving method for achieving a wide viewing angle may be employed. This driving method is referred to as sub-pixel driving.

Since the thin film transistor 170 which is arranged in each pixel has a light transmitting property, a high aperture ratio can be realized even when one pixel is divided into a plurality of sub-pixels for sub-pixel driving in order to realize a wide viewing angle.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is another driving method which is so-called double-frame rate driving. In the double-frame rate driving, a vertical synchronizing frequency is set 1.5 times or more, preferably 2 times or more as high as a usual vertical synchronizing frequency, whereby moving image characteristics are improved.

Further alternatively, in order to improve the moving-image characteristics of a liquid crystal display device, a driving method may be employed, in which a plurality of LEDs (light-emitting diodes) or a plurality of EL light sources is used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed on one screen.

By combining these driving methods, the display characteristics of a liquid crystal display device, such as moving-image characteristics, can be improved as compared to those of conventional liquid crystal display devices.

The n-channel transistor disclosed in this specification includes an oxide semiconductor film which is used for a channel formation region and has excellent dynamic characteristics; thus, it can be combined with these driving methods.

The use of an oxide semiconductor for a thin film transistor leads to a reduction in manufacturing cost. Since moisture and the like which are impurities are reduced for increasing purity of the oxide semiconductor film by a heat treatment for dehydration or dehydrogenation, it is not necessary to use an ultrapure oxide semiconductor target and a special sputtering apparatus provided with a deposition chamber whose dew point temperature is lowered. Therefore, a semiconductor device including a thin film transistor which has favorable electric characteristics and high reliability can be manufactured.

The channel formation region in the oxide semiconductor layer is a high-resistance region; thus, electric characteristics of the thin film transistor are stabilized and increase in off current or the like can be prevented. Therefore, a semiconductor device including a thin film transistor which has favorable electric characteristics and high reliability can be provided.

This embodiment can be implemented in appropriate combination with the structures described in the other embodiments.

Embodiment 7

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of a voltage to a light-emitting element, electrons and holes are separately injected from a pair of electrodes into a layer containing a light-emitting organic compound, and thus current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 16:
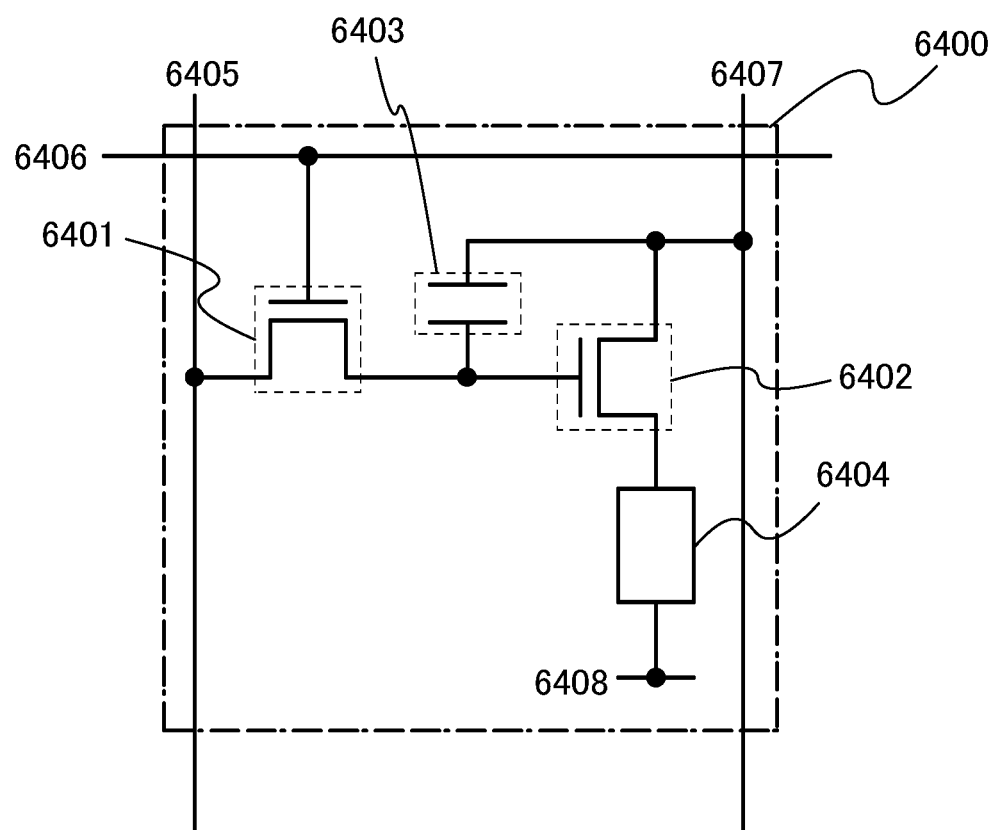
FIG. 16 is an equivalent circuit diagram of a pixel in a semiconductor device.

FIG. 16 is a diagram illustrating an example of a pixel structure to which digital time grayscale driving can be applied, as an example of a semiconductor device.

The structure and operation of a pixel which can be driven by a digital time grayscale method will be described. An example is described here in which one pixel includes two n-channel transistors each using an oxide semiconductor layer for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power source line 6407 through the capacitor 6403, a first electrode of the driving transistor 6402 is connected to the power source line 6407, and a second electrode of the driving transistor 6402 is connected to a first electrode (pixel electrode layer) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power source potential. The low power source potential is lower than a high power source potential which is supplied to the power source line 6407. For example, GND, 0 V, or the like may be set as the low power source potential. The difference between the high power source potential and the low power source potential is applied to the light-emitting element 6404 so that current flows through the light-emitting element 6404, whereby the light-emitting element 6404 emits light. Thus, each potential is set so that the difference between the high power source potential and the low power source potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between a channel formation region and a gate electrode.

Here, in the case of using a voltage-input voltage-driving method, a video signal is input to the gate of the driving transistor 6402 to make the driving transistor 6402 completely turned on or off. That is, the driving transistor 6402 operates in a linear region, and thus, a voltage higher than the voltage of the power source line 6407 is applied to the gate of the driving transistor 6402. Note that a voltage greater than or equal to "power source line voltage+$V_{th}$ of the driving transistor 6402" is applied to the signal line 6405.

In the case of using an analog grayscale method instead of the digital time grayscale method, the same pixel structure as in FIG. 16 can be employed by inputting signals in a different way.

In the case of using the analog grayscale driving method, a voltage greater than or equal to "forward voltage of the light-emitting element 6404+$V_{th}$ of the driving transistor 6402" is applied to the gate of the driving transistor 6402. The forward voltage of the light-emitting element 6404 refers to a voltage to obtain a desired luminance, and includes at least a forward threshold voltage. By inputting a video signal to enable the driving transistor 6402 to operate in a saturation region, current can flow through the light-emitting element 6404. In order that the driving transistor 6402 can operate in the saturation region, the potential of the power source line 6407 is higher than a gate potential of the driving transistor 6402. With the analog video signal, current in accordance with the video signal flows through the light-emitting element 6404, and the analog grayscale driving method can be performed.

Note that the pixel structure is not limited to that illustrated in FIG. 16. For example, the pixel in FIG. 16 can further include a switch, a resistor, a capacitor, a transistor, a logic circuit, or the like.

Next, structures of the light-emitting element are described with reference to FIGS. 17A to 17C. Here, a cross-sectional structure of a pixel is described by taking an n-channel driving TFT as an example. Driving TFTs 7001, 7011, and 7021 used in semiconductor devices illustrated in FIGS. 17A, 17B, and 17C, respectively, can be formed in a manner similar to that of the thin film transistor described in Embodiment 1 and are highly reliable thin film transistors each including an oxide semiconductor layer. Alternatively, the thin film transistors described in Embodiment 2 or 3 can be used as the driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure is described with reference to FIG. 17A.

Figure 17A:
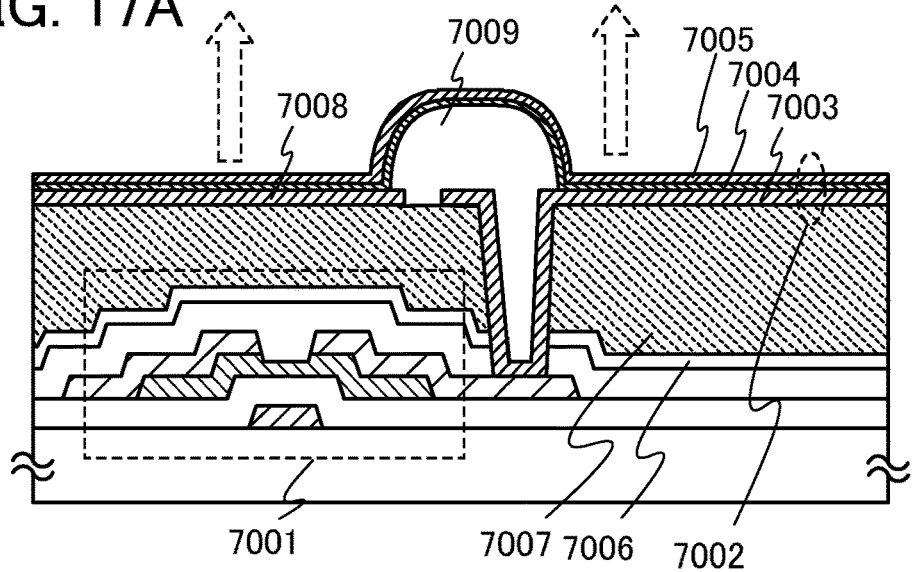
FIGS. 17A to 17C are cross-sectional views each illustrating a semiconductor device.

FIG. 17A is a cross-sectional view of a pixel in the case where the driving TFT 7001 is an n-type TFT and light is emitted from a light-emitting element 7002 to an anode 7005 side. In FIG. 17A, a cathode 7003 of the light-emitting element 7002 is electrically connected to the driving TFT 7001, and a light-emitting layer 7004 and the anode 7005 are stacked in this order over the cathode 7003. Further, the driving TFT 7001 is covered with a protective insulating layer 7006 which is a silicon nitride film, an aluminum nitride film or the like and further covered with a planarization insulating film 7007. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. However, it is not necessary to form all of these layers. The anode 7005 is formed using a conductive film having a light transmitting property such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The cathode 7003 is insulated from a cathode 7008 of an adjacent pixel by a partition wall 7009. The cathode 7008 of the adjacent pixel overlaps with an oxide semiconductor layer and a gate insulating layer of the driving TFT 7001. In the case where a bias-temperature stress test (hereinafter, referred to as a BT test) for examining reliability of a thin film transistor is carried out, by forming the cathode 7008 of the adjacent pixel which overlaps with a channel formation region of the driving TFT 7001, the amount of change in threshold voltage of the driving TFT 7001 between before and after the BT test can be reduced.

A region where the light-emitting layer 7004 is sandwiched between the cathode 7003 and the anode 7005 corresponds to the light-emitting element 7002. In the case of the pixel illustrated in FIG. 17A, light is emitted from the light-emitting element 7002 to the anode 7005 side as indicated by arrows.

Next, a light-emitting element having a bottom emission structure is described with reference to FIG. 17B. FIG. 17B is a cross-sectional view of a pixel in the case where the driving TFT 7011 is an n-type TFT and light is emitted from a light-emitting element 7012 to a cathode 7013 side. In FIG. 17B, the cathode 7013 of the light-emitting element 7012 is formed over a conductive film 7017 having a light transmitting property which is electrically connected to the driving TFT 7011, and a light-emitting layer 7014 and an anode 7015 are stacked in this order over the cathode 7013.

A light-blocking film 7016 for reflecting or blocking light may be formed so as to cover the anode 7015 when the anode 7015 has a light transmitting property. For the cathode 7013, various materials can be used as in the case of FIG. 17A as long as the cathode 7013 is formed using a conductive material having a low work function. The cathode 7013 is formed to have a thickness that enables transmission of light (preferably, approximately 5 nm to 30 nm). For example, an aluminum film with a thickness of 20 nm can be used as the cathode 7013. Similar to the case of FIG. 17A, the light-emitting layer 7014 may be formed using either a single layer or a plurality of layers stacked. The anode 7015 is not required to transmit light, but can be formed using a conductive material having a light transmitting property as in the case of FIG. 17A. As the light-blocking film 7016, a metal or the like that reflects light can be used, for example; however, it is not limited to a metal film. For example, a resin or the like to which black pigments are added can also be used.

The cathode 7013 is insulated from a cathode 7018 of an adjacent pixel by a partition wall 7019. The cathode 7018 of the adjacent pixel overlaps with an oxide semiconductor layer and a gate insulating layer of the driving TFT 7011. In the case where a bias-temperature stress test (hereinafter, referred to as a BT test) for examining reliability of a thin film transistor is carried out, by forming the cathode 7018 of the adjacent pixel which overlaps with a channel formation region of the driving TFT 7011, the amount of change in threshold voltage of the driving TFT 7011 between before and after the BT test can be reduced.

A region where the light-emitting layer 7014 is sandwiched between the cathode 7013 and the anode 7015 corresponds to the light-emitting element 7012. In the case of the pixel illustrated in FIG. 17B, light is emitted from the light-emitting element 7012 to the cathode 7013 side as indicated by an arrow.

Further, since the driving TFT 7011 has a light transmitting property, light emitted from a light-emitting element of the pixel adjacent to the light-emitting element 7012 is emitted to the cathode 7013 side through the driving TFT 7011 as indicated by an arrow.

Next, a light-emitting element having a dual emission structure is described with reference to FIG. 17C. In FIG. 17C, a cathode 7023 of a light-emitting element 7022 is formed over a conductive film 7027 having a light transmitting property which is electrically connected to the driving TFT 7021, and a light-emitting layer 7024 and an anode 7025 are stacked in this order over the cathode 7023. As in the case of FIG. 17A, the cathode 7023 can be formed using any of a variety of materials as long as the cathode 7023 is formed using a conductive material having a low work function. The cathode 7023 is formed to have a thickness that enables transmission of light. For example, an Al film having a thickness of 20 nm can be used as the cathode 7023. The light-emitting layer 7024 may be formed using a single layer or a plurality of layers stacked as in the case of FIG. 17A. As in the case of FIG. 17A, the anode 7025 can be formed using a conductive material having a light transmitting property.

The cathode 7023 is insulated from a cathode 7028 of an adjacent pixel by a partition wall 7029. The cathode 7028 of the adjacent pixel overlaps with an oxide semiconductor layer and a gate insulating layer of the driving TFT 7021. In the case where a bias-temperature stress test (hereinafter, referred to as a BT test) for examining reliability of a thin film transistor is carried out, by forming the cathode 7028 of the adjacent pixel which overlaps with a channel formation region of the driving TFT 7021, the amount of change in threshold voltage of the driving TFT 7021 between before and after the BT test can be reduced.

A region where the cathode 7023, the light-emitting layer 7024, and the anode 7025 overlap with one another corresponds to the light-emitting element 7022. In the case of the pixel illustrated in FIG. 17C, light is emitted from the light-emitting element 7022 to both the anode 7025 side and the cathode 7023 side as indicated by arrows.

Further, since the driving TFT 7021 has a light transmitting property, light emitted from a light-emitting element of the pixel adjacent to the light-emitting element 7022 is emitted to a cathode 7023 side through the driving TFT 7021 as indicated by an arrow.

Although an example in which the cathode which is a pixel electrode layer overlaps with the channel formation region of the TFT of the adjacent pixel is described in this embodiment, the present invention is not particularly limited to this example, and a structure in which the cathode overlaps with the channel formation region of the TFT to which the cathode is electrically connected may be employed.

Although an organic EL element is described here as a light-emitting element, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 17B:
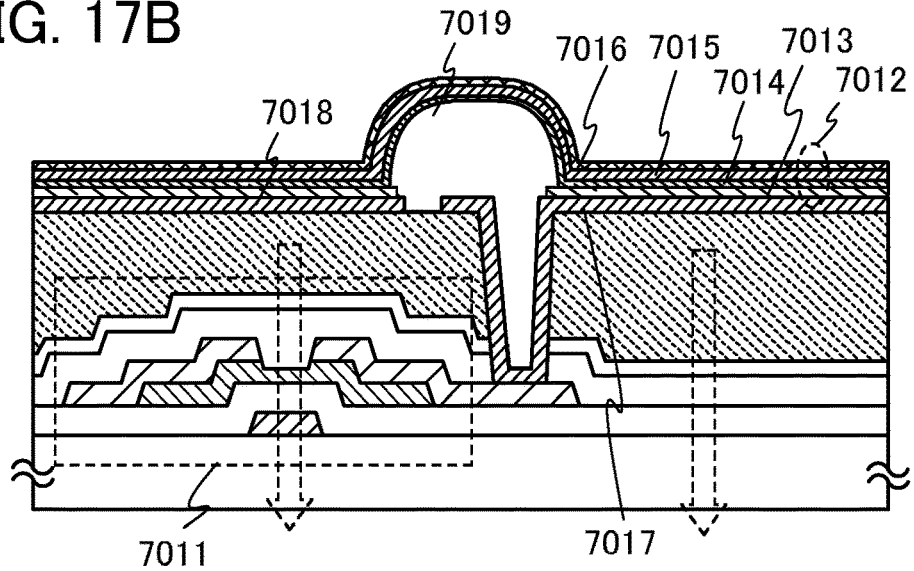
Figure 17C:
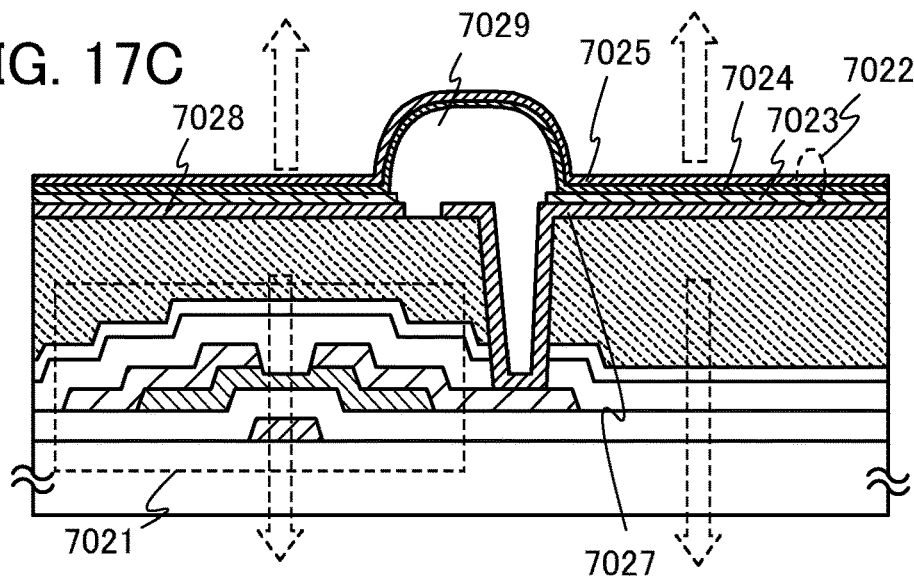

Note that the structure of the semiconductor device is not limited to those illustrated in FIGS. 17A to 17C and can be modified in various ways based on techniques disclosed in this specification.

Through the above steps, a highly reliable light-emitting display device (display panel) can be manufactured as a semiconductor device.

This embodiment can be implemented in appropriate combination with the structures described in the other embodiments.

Embodiment 8

A semiconductor device which has a thin film transistor manufactured by the process described in any of Embodiments 1 to 7 disclosed in this specification can be applied to a variety of electronic appliances (including amusement machines).

Examples of electronic appliances include a television set (also referred to as a television or a television receiver), a monitor of a computer or the like, a camera such as a digital camera or a digital video camera, a digital photo frame, a mobile phone set (also referred to as a mobile phone or a mobile phone device), a portable game console, a portable information terminal, an audio reproducing device, a large-sized game machine such as a pachinko machine, and the like.

Figure 18A:
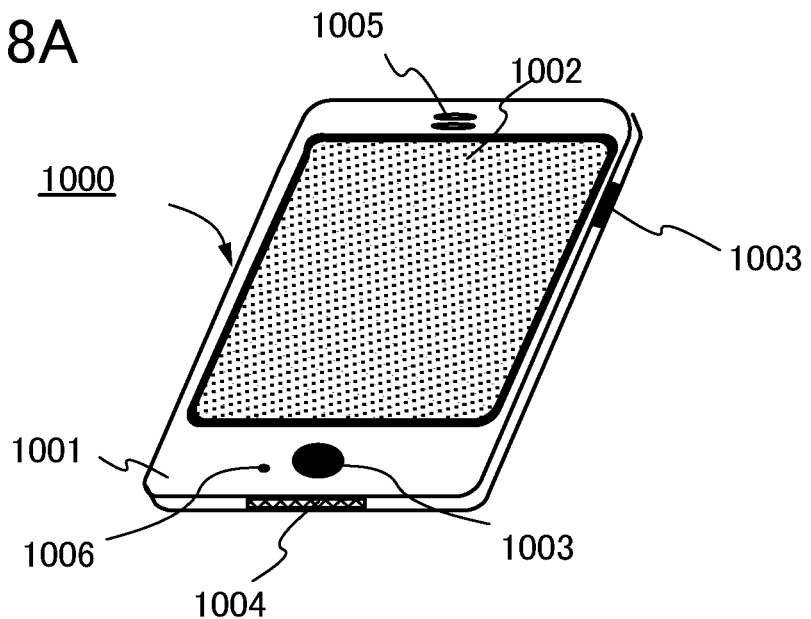
FIGS. 18A and 18B are diagrams each illustrating a semiconductor device.

FIG. 18A illustrates an example of a mobile phone 1000. The mobile phone 1000 includes a display portion 1002 incorporated in a housing 1001, operation buttons 1003, an external connection port 1004, a speaker 1005, a microphone 1006 and the like.

When the display portion 1002 of the mobile phone 1000 illustrated in FIG. 18A is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display on the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation buttons 1003 of the housing 1001. Alternatively, the screen modes can be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 can function as an image sensor. For example, an image of a palm print, a fingerprint, or the like is taken when the display portion 1002 is touched with a palm or a finger, whereby personal identification can be performed. Further, by providing a backlight which emits near-infrared light or a sensing light source which emits near-infrared light for the display portion, an image of a finger vein, a palm vein, or the like can be taken.

A plurality of thin film transistors which is described in Embodiment 1 is arranged in the display portion 1002. Since the thin film transistors and wirings have light transmitting properties, they do not block incident light in the case of providing an optical sensor for the display portion 1002 and thus are effective. In addition, also in the case of providing a backlight which emits near-infrared light or a sensing light source which emits near-infrared light for the display portion, the thin film transistors and the wirings do not block light and thus are effective.

Figure 18B:
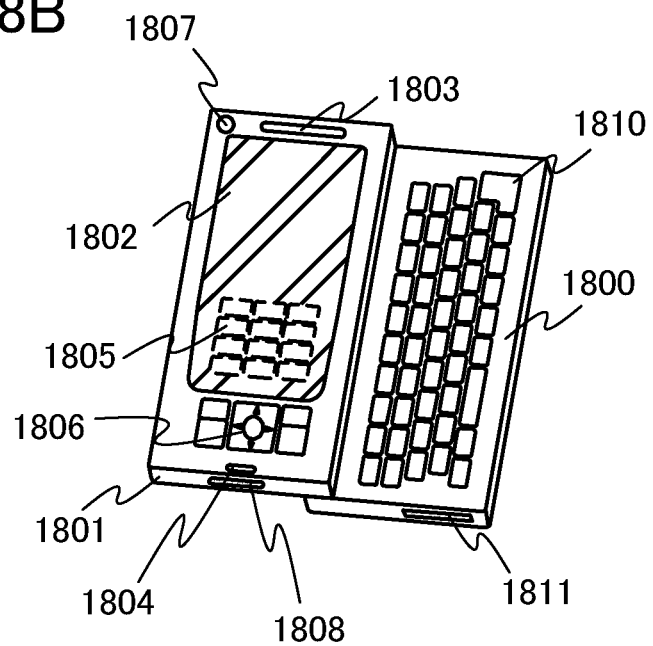

FIG. 18B also illustrates an example of a mobile phone. A portable information terminal whose example is illustrated in FIG. 18B can have a plurality of functions. For example, in addition to a telephone function, such a portable information terminal can have a function of processing a variety of pieces of data by incorporating a computer.

The portable information terminal illustrated in FIG. 18B has a housing 1800 and a housing 1801. The housing 1800 includes a display panel 1802, a speaker 1803, a microphone 1804, a pointing device 1806, a camera lens 1807, an external connection terminal 1808, and the like. The housing 1801 includes a keyboard 1810, an external memory slot 1811, and the like. In addition, an antenna is incorporated in the housing 1801.

The display panel 1802 is provided with a touch panel. A plurality of operation keys 1805 which is displayed as images is illustrated by dashed lines in FIG. 18B.

Further, in addition to the above structure, a contactless IC chip, a small memory device, or the like may be incorporated.

The display device of the present invention can be used for the display panel 1802 and the direction of display is changed appropriately depending on an application mode. Further, the display device is provided with the camera lens 1807 on the same surface as the display panel 1802, and thus it can be used as a video phone. The speaker 1803 and the microphone 1804 can be used for videophone calls, recording, and playing sound, etc. as well as voice calls. Moreover, the housings 1800 and 1801 in a state where they are developed as illustrated in FIG. 18B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 19A:
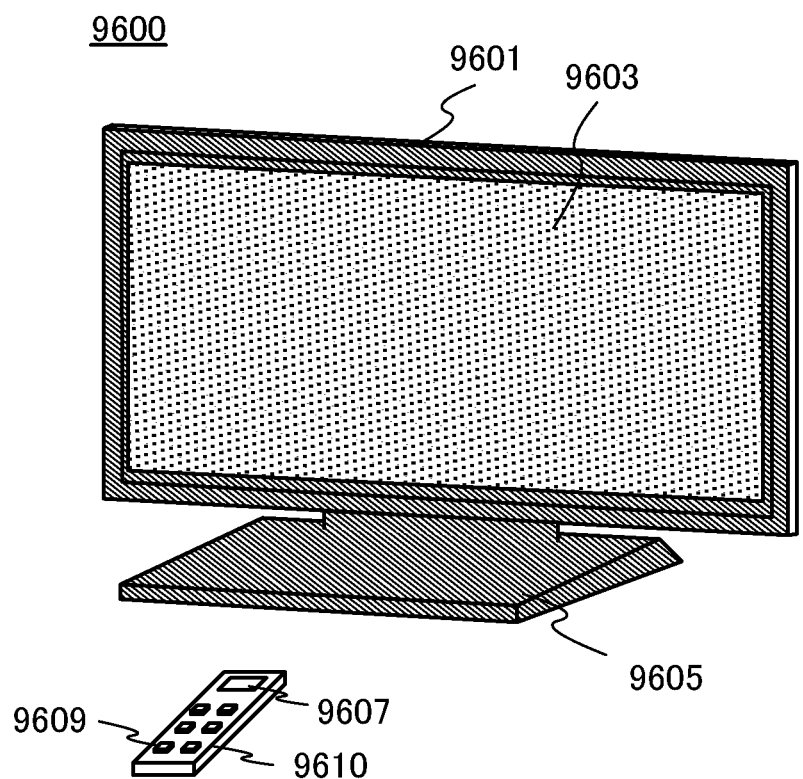
FIGS. 19A and 19B are diagrams each illustrating a semiconductor device.

FIG. 19A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Since a plurality of thin film transistors having light transmitting properties which are described in Embodiment 1 is arranged in the display portion 9603, an aperture ratio can be high also in the case of realizing an image with high definition by increasing the number of scan lines, for example, to 2000 (considering so-called 4k2k images with 4096×2160 pixels, 3840×2160 pixels, or the like). However, when the size of the display portion 9603 is 60 inches, 120 inches, or the like, which exceeds 10 inches, there is a concern that the wiring resistance of a wiring having a light transmitting property becomes problematic; therefore, a scan line or source line is preferably provided with a low-resistance metal wiring as an auxiliary wiring.

Figure 19B:
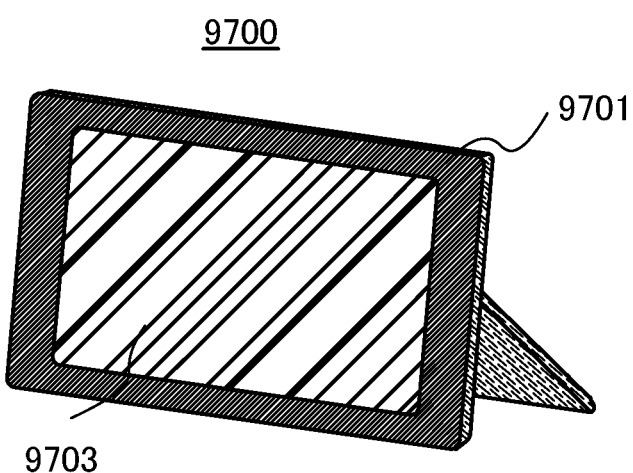

FIG. 19B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted into the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 20:
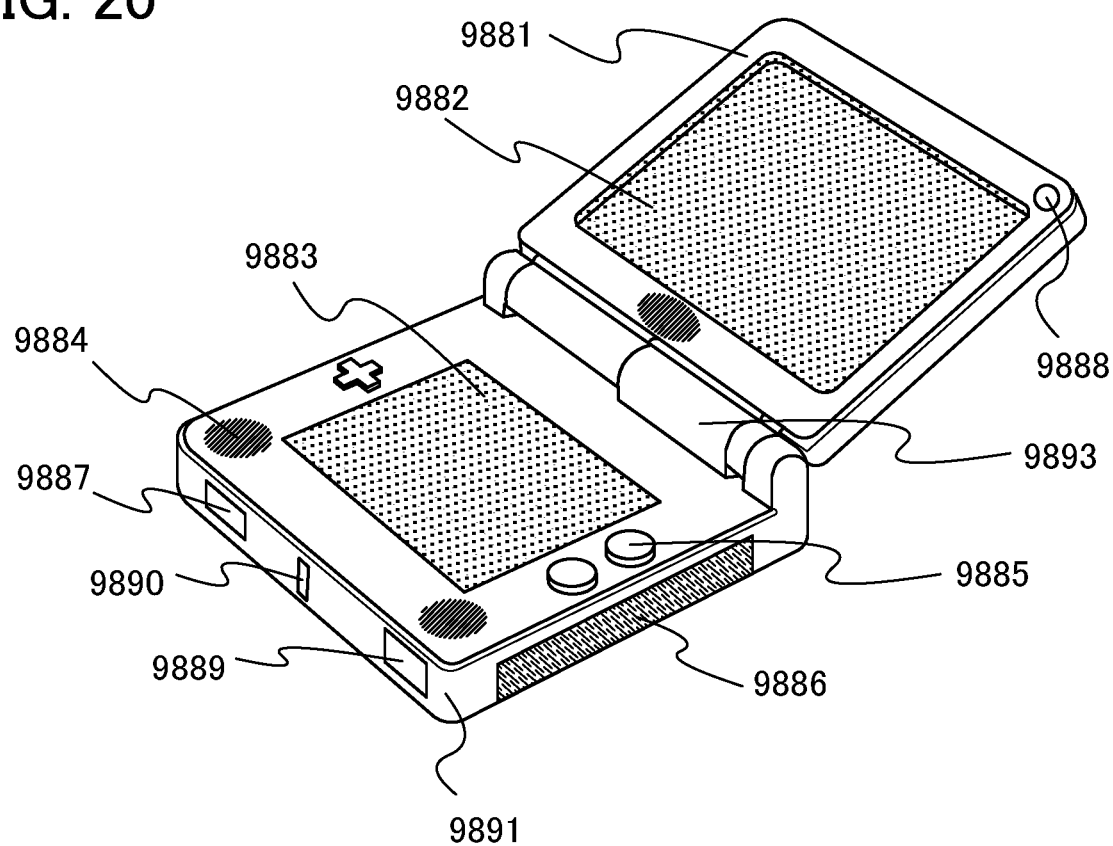
FIG. 20 is a diagram illustrating a semiconductor device.

FIG. 20 illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 20 includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable amusement machine illustrated in FIG. 20 has a function of reading a program or data stored in a recording medium to display it on the display portion, and a function of sharing information with another portable amusement machine by wireless communication. The portable amusement machine illustrated in FIG. 20 can have various functions without limitation to the above.

As described above, the thin film transistor having a light transmitting property can be arranged in a display portion or a display panel of a variety of electronic appliances such as the above ones. A highly reliable electronic appliance having a display portion with a high aperture ratio can be provided by using the thin film transistor having a light transmitting property as a switching element of the display panel.

This embodiment can be implemented in appropriate combination with the structures described in the other embodiments.

This application is based on Japanese Patent Application serial no. 2009-164265 filed with Japan Patent Office on Jul. 10, 2009, the entire contents of which are hereby incorporated by reference.

EXPLANATION OF REFERENCE

100: substrate, 101: gate electrode layer, 102: gate insulating layer, 103: oxide semiconductor layer, 105*a*: source electrode layer, 105*b*: drain electrode layer, 107: first protective insulating layer, 108: capacitor wiring, 110: pixel electrode layer, 121: terminal, 122: terminal, 124: contact hole, 125: contact hole, 126: contact hole, 127: contact hole, 128: conductive film having a light transmitting property, 129: conductive film having a light transmitting property, 131: second protective insulating layer, 132: conductive film having a light transmitting property, 133: first oxide semiconductor layer, 134: second oxide semiconductor layer, 135: capacitor electrode, 150: terminal, 151: terminal, 152: gate insulating layer, 153: connection electrode layer, 154: first protective insulating layer, 155: conductive film having a light transmitting property, 156: electrode layer, 157: second protective insulating layer, 170: thin film transistor, 400: substrate, 401: gate electrode layer, 402: gate insulating layer, 403: oxide semiconductor layer, 405*a*: source electrode layer, 405*b*: drain electrode layer, 407: oxide insulating film, 430: first oxide semiconductor layer, 431: second oxide semiconductor layer, 440: thin film transistor, 442: second oxide semiconductor layer, 443: oxide semiconductor layer, 444: second oxide semiconductor layer, 450: substrate, 451: gate electrode layer, 452: gate insulating layer, 453: oxide semiconductor layer, 455*a*: source electrode layer, 455*b*: drain electrode layer, 457: oxide insulating film, 460: thin film transistor, 470: thin film transistor, 480: thin film transistor, 481: oxide semiconductor layer, 483: oxide semiconductor layer, 1000: mobile phone, 1001: housing, 1002: display portion, 1003: operation button, 1004: external connection port, 1005: speaker, 1006: microphone, 1300: substrate, 1301: display portion, 1302: driving portion, 1303: signal line driver circuit, 1304: scan line driver circuit, 1305: pixel, 1306: scan line, 1308: signal line, 1309: external connection terminal, 1400 substrate, 1401: gate electrode layer, 1402: gate insulating layer, 1403: oxide semiconductor layer, 1405*a*: source electrode layer, 1405*b*: drain electrode layer, 1418: channel protective layer, 1430: thin film transistor, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 1908: display panel, 1920: substrate, 1921: display portion, 1922: sealant, 1923: substrate, 1924: FPC, 1925: first sealant, 1926: second sealant, 1927: driver IC, 6400: pixel, 6401: switching transistor, 6402: driving transistor, 6403: capacitor, 6404: light-emitting element, 6405: signal line, 6406: scan line, 6407: power source line, 6408: common electrode, 7001: driving TFT, 7002: light-emitting element, 7003: cathode, 7004: light-emitting layer, 7005: anode, 7006: protective insulating layer, 7007: planarization insulating film, 7008: cathode, 7009: partition wall, 7011: driving TFT, 7012: light-emitting element, 7013: cathode, 7014: light-emitting layer, 7015: anode, 7016: light-blocking film, 7017: conductive film having a light transmitting property, 7018: cathode, 7019: partition wall, 7021: driving TFT, 7022: light-emitting element, 7023: cathode, 7024: light-emitting layer, 7025: anode, 7027: conductive film having a light transmitting property, 7028: cathode, 7029: partition wall, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: connection portion.

The invention claimed is:

1. A semiconductor device comprising:
a pixel, the pixel comprising:
　a storage capacitor; and
　a transistor, the transistor comprising:
　　a gate electrode layer over a substrate with an insulating surface;
　　a gate insulating layer over the gate electrode layer;
　　an oxide semiconductor layer over the gate insulating layer;
　　a source electrode layer having a region in contact with a top surface of the oxide semiconductor layer;
　　a drain electrode layer having a region in contact with the top surface of the oxide semiconductor layer; and
　　an insulating layer over the source electrode layer and the drain electrode layer;
　a pixel electrode layer over the insulating layer,
wherein the pixel electrode layer is in contact with a top surface of one of the source electrode layer and the drain electrode layer via an opening in the insulating layer,
wherein the pixel electrode has a region overlapping with an electrode comprising a metal oxide via the insulating layer, and
wherein the electrode functions as one electrode of the storage capacitor.

2. A semiconductor device comprising:
a pixel, the pixel comprising:
　a storage capacitor; and
　a transistor, the transistor comprising:
　　a gate electrode layer over a substrate with an insulating surface;
　　a gate insulating layer over the gate electrode layer;
　　an oxide semiconductor layer over the gate insulating layer;
　　a source electrode layer having a region in contact with a top surface of the oxide semiconductor layer;
　　a drain electrode layer having a region in contact with the top surface of the oxide semiconductor layer; and
　　an insulating layer over the source electrode layer and the drain electrode layer;
　a pixel electrode layer over the insulating layer; and
　a light-emitting layer over the pixel electrode layer,
wherein the pixel electrode layer is in contact with a top surface of one of the source electrode layer and the drain electrode layer via an opening in the insulating layer,
wherein the pixel electrode has a region overlapping with an electrode comprising a metal oxide via the insulating layer,
wherein the electrode functions as one electrode of the storage capacitor, and
wherein light emitted from the light-emitting layer is emitted to a transistor side.

3. A semiconductor device comprising:
a pixel, the pixel comprising:
　a storage capacitor; and
　a transistor, the transistor comprising:
　　a gate electrode layer over and in contact with a substrate with an insulating surface;
　　a gate insulating layer over the gate electrode layer;
　　a first oxide semiconductor layer over the gate insulating layer;
　　a second oxide semiconductor layer over the first oxide semiconductor layer;
　　a source electrode layer having a region in contact with a top surface of the second oxide semiconductor layer;
　　a drain electrode layer having a region in contact with the top surface of the second oxide semiconductor layer; and
　　an insulating layer over the source electrode layer and the drain electrode layer;
　a pixel electrode layer over the insulating layer; and
　a light-emitting layer over the pixel electrode layer,
wherein the pixel electrode layer is in contact with a top surface of one of the source electrode layer and the drain electrode layer via an opening in the insulating layer,
wherein the pixel electrode has a region overlapping with an electrode comprising a metal oxide via the insulating layer,
wherein the electrode functions as one electrode of the storage capacitor, and
wherein light emitted from the light-emitting layer is emitted to a transistor side.

4. The semiconductor device according to claim 1, wherein the oxide semiconductor layer comprises In, Ga, and Zn.

5. The semiconductor device according to claim 2, wherein the oxide semiconductor layer comprises In, Ga, and Zn.

6. The semiconductor device according to claim 3, wherein the first oxide semiconductor layer comprises In, Ga, and Zn.

7. The semiconductor device according to claim 1, wherein each of the oxide semiconductor layer and the metal oxide comprises In, Ga, and Zn.

8. The semiconductor device according to claim 2, wherein each of the oxide semiconductor layer and the metal oxide comprises In, Ga, and Zn.

9. The semiconductor device according to claim 3, wherein each of the first oxide semiconductor layer and the metal oxide comprises In, Ga, and Zn.

10. The semiconductor device according to claim 1, wherein the oxide semiconductor layer comprises a crystalline region.

11. The semiconductor device according to claim 2, wherein the oxide semiconductor layer comprises a crystalline region.

12. The semiconductor device according to claim 3, wherein the first oxide semiconductor layer comprises a crystalline region.

* * * * *